(12) United States Patent
Tan et al.

(10) Patent No.: US 12,352,809 B2
(45) Date of Patent: Jul. 8, 2025

(54) APPARATUS AND METHOD FOR BURN-IN BOARD ALIGNMENT AND SEALING BETWEEN CHAMBER AND FRAME FOR SEMICONDUCTOR BURN-IN PROCESS

(71) Applicant: MSV SYSTEMS & SERVICES PTE LTD, Singapore (SG)

(72) Inventors: Teck Huat Tan, Singapore (SG); Chun Hong Low, Singapore (SG)

(73) Assignee: MSV SYSTEMS & SERVICES PTE LTD, Singapore (SG)

( * ) Notice: Subject to any disclaimer, the term of this patent is extended or adjusted under 35 U.S.C. 154(b) by 223 days.

(21) Appl. No.: 18/258,235

(22) PCT Filed: Dec. 29, 2021

(86) PCT No.: PCT/SG2021/050828
§ 371 (c)(1),
(2) Date: Jun. 19, 2023

(87) PCT Pub. No.: WO2022/146237
PCT Pub. Date: Jul. 7, 2022

(65) Prior Publication Data
US 2024/0053397 A1    Feb. 15, 2024

Related U.S. Application Data

(63) Continuation-in-part of application No. PCT/SG2020/050791, filed on Dec. 30, 2020.

(51) Int. Cl.
*G01R 31/00* (2006.01)
*G01R 31/28* (2006.01)

(52) U.S. Cl.
CPC ..... *G01R 31/2867* (2013.01); *G01R 31/2862* (2013.01); *G01R 31/2863* (2013.01); *G01R 31/287* (2013.01); *G01R 31/2874* (2013.01)

(58) Field of Classification Search
CPC ............ G01R 31/2862; G01R 31/2863; G01R 31/2867; G01R 31/2868; G01R 31/287; G01R 31/2874; G01R 31/2893
See application file for complete search history.

(56) References Cited

U.S. PATENT DOCUMENTS 5,317,257 A      5/1994  Sakai
6,166,555 A  * 12/2000  Lillja .................. G01R 31/2862
                                                      324/763.01
(Continued)

FOREIGN PATENT DOCUMENTS

CN    206387749 U    8/2017
CN    206710573 U    12/2017
(Continued)

OTHER PUBLICATIONS

Related U.S Patent Application Office Action dated Sep. 12, 2023 in connection with U.S. Appl. No. 17/608,632, 47 pages.
(Continued)

*Primary Examiner* — Thang X Le
(74) *Attorney, Agent, or Firm* — Eschweiler & Potashnik, LLC

(57) ABSTRACT

The present disclosure relates to burn-in apparatus, transfer method, burn-in chamber, and interchangeable frame thereof for semiconductor devices burn-in process. The burn-in apparatus comprises a burn-in chamber with an incomplete base which is to be completed and thermally insulated in cooperation with a thermal insulation base of at least one interchangeable frame which is to be removably moved into and docked in the chamber to complete the burn-in apparatus. Cooperating alignment elements are respectively arranged at the frame and the chamber, and configured to progressively and movably couple to each other to lift the frame to bring a set of burn-in boards that are supported on the frame into alignment for insertion into a set of receiving (Continued)

connectors in the chamber. Cooperating thermal insulation side elements may be respectively arranged at the frame and the chamber, and include complementary characteristics configured to provide a clearance gap between the thermal insulation side elements when they partially overlap each other and an abutting fit when they substantially or fully overlap each other.

19 Claims, 11 Drawing Sheets

(56) References Cited

U.S. PATENT DOCUMENTS

| | | | | |
|---|---|---|---|---|
| 2006/0001436 | A1* | 1/2006 | Dangelo | G01R 31/2863 324/750.05 |
| 2006/0071678 | A1 | 4/2006 | Norris | |
| 2006/0186909 | A1* | 8/2006 | Aube | G01R 31/2875 324/750.09 |
| 2006/0208721 | A1 | 9/2006 | Soeta et al. | |
| 2007/0159198 | A1* | 7/2007 | Teoh | G01R 31/2867 324/750.05 |
| 2019/0204378 | A1 | 7/2019 | Gopal | |
| 2019/0235005 | A1 | 8/2019 | Ho | |
| 2020/0379033 | A1* | 12/2020 | Chang | G01R 31/2868 |
| 2022/0120808 | A1* | 4/2022 | Fawcett | G01R 31/2867 |

FOREIGN PATENT DOCUMENTS

| | | | |
|---|---|---|---|
| CN | 111289877 | A | 6/2020 |
| JP | 10177056 | A | 6/1998 |
| JP | H10177056 | * | 6/1998 |
| JP | 2004286499 | A | 10/2004 |
| JP | 2020060400 | A | 4/2020 |

OTHER PUBLICATIONS

Kiyoshi Komatsu et al., JP-10177056-A, Machine Translation, (Year: 1998).
U.S. Patent Application Notice of Allowance dated Mar. 6, 2024 in connection with U.S. Appl. No. 17/608,632, 82 pages.
PCT Search Report dated Mar. 8, 2022 in connection with PCT Application No. PCT/SG2021/050828.
Patent Cooperation Treaty, "International Search Report and Written Opinion for PCT Patent Application No. PCT/SG2020/050791", Mailed Date: Mar. 29, 2021, 11 pages.
Patent Cooperation Treaty, "International Preliminary Report on Patentability for PCT Patent Application No. PCT/SG2020/050791", Completion Date: Aug. 12, 2021, 22 pages.
Patent Cooperation Treaty, "Written Opinion for PCT Patent Application No. PCT/SG2020/050791", Mailed Date: Jun. 14, 2021, 5 pages.
Related U.S Patent Application dated Nov. 3, 2021 in connection with U.S. Appl. No. 17/608,632.
European Search Report dated Nov. 18, 2022, in connection with European Application Serial No. 20934241.9.

* cited by examiner

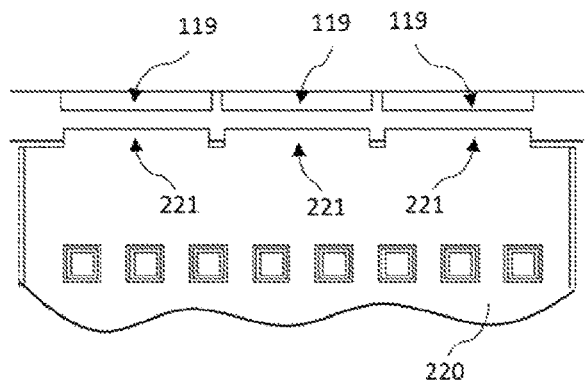
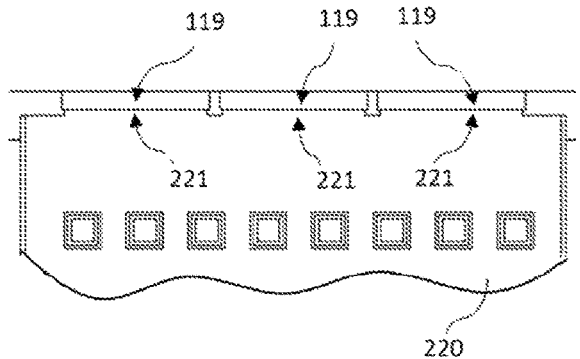
Figure 1A　　　　　　　　　　　　Figure 1B
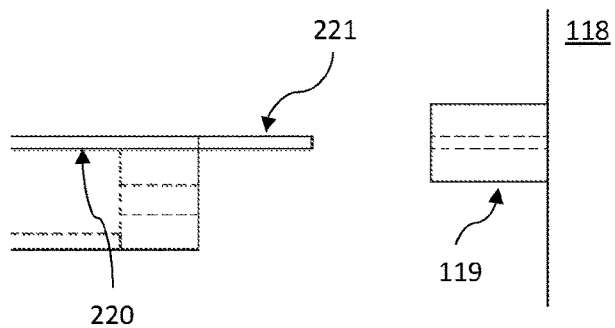
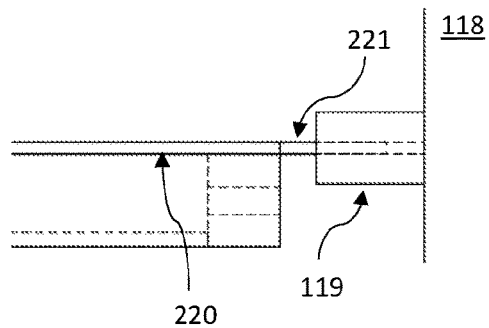
Figure 1C　　　　　　　　　　　　Figure 1D

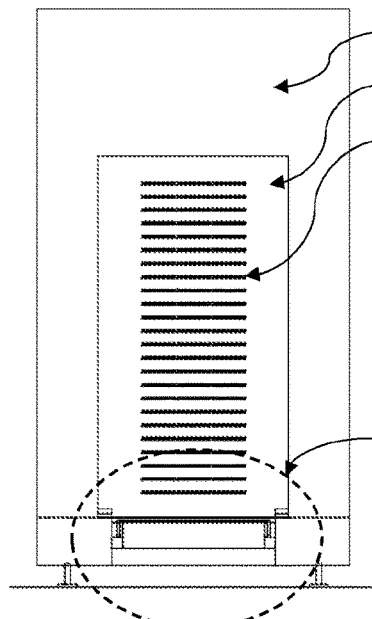
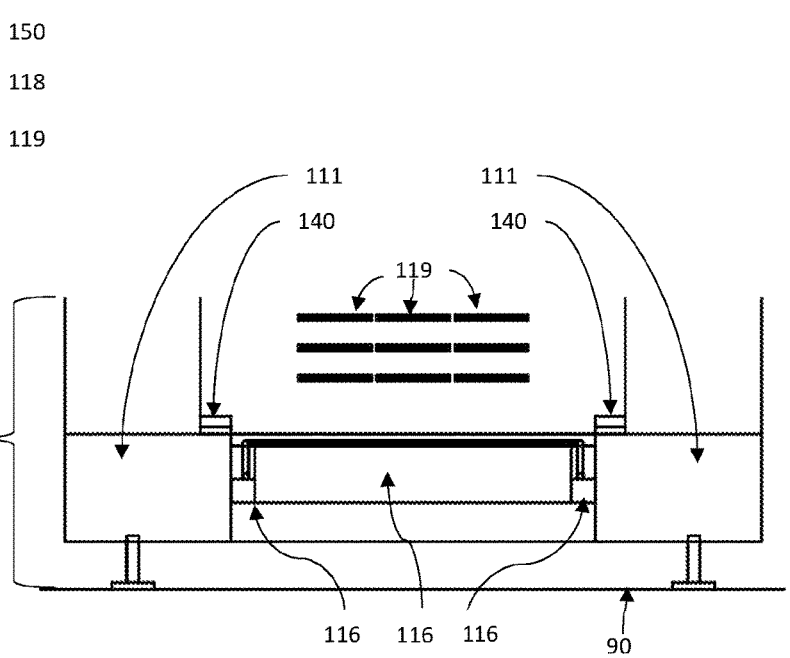
Figure 5A
Figure 5B
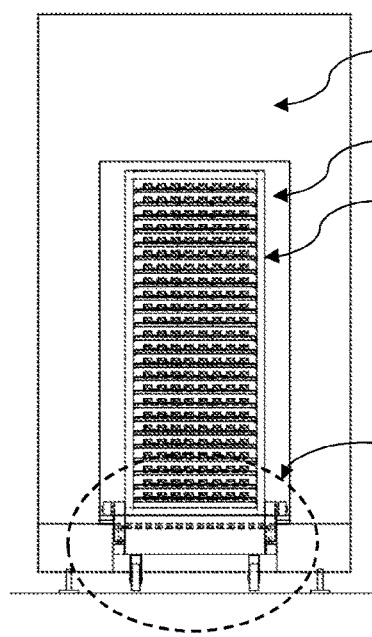
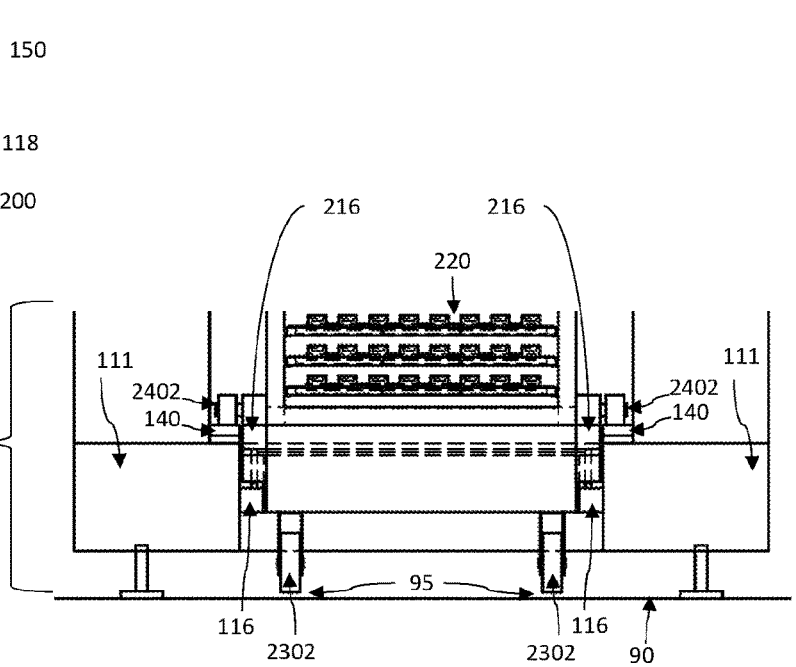
Figure 5C
Figure 5D

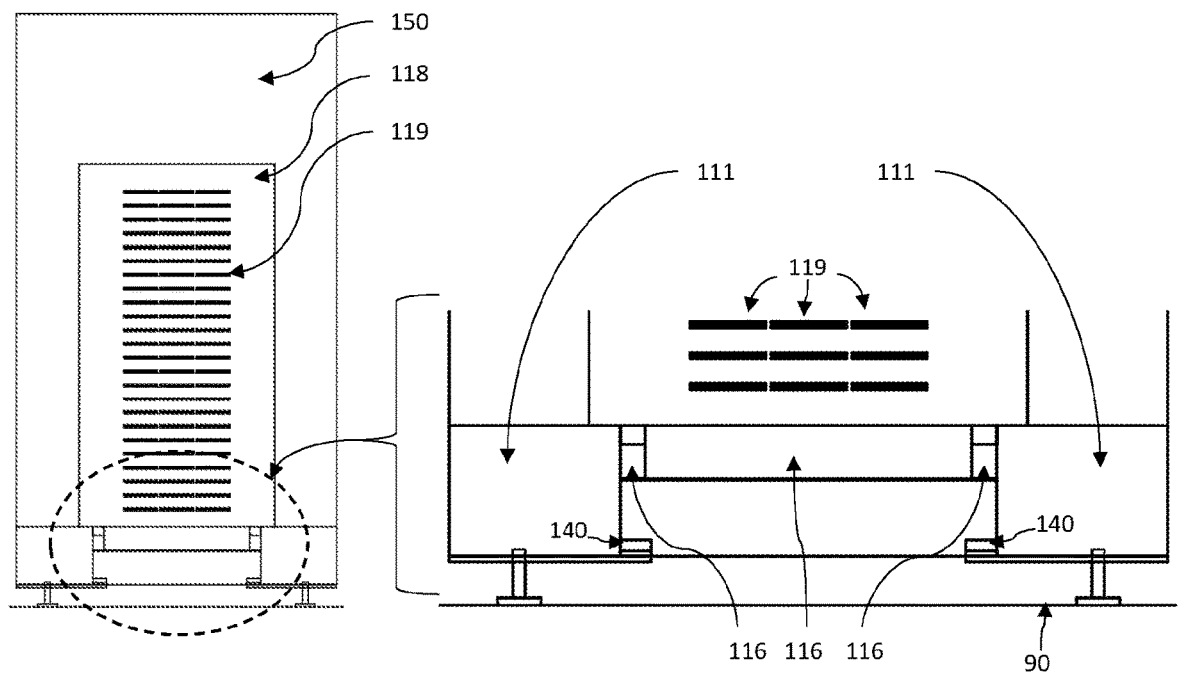
Figure 8A
Figure 8B
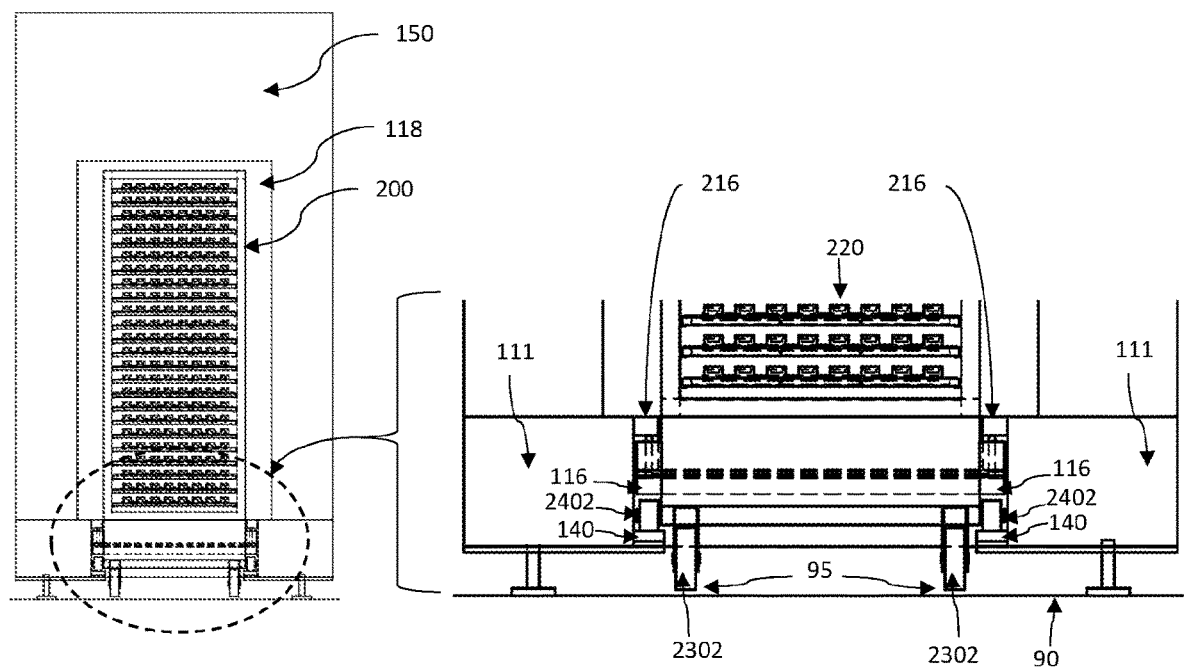
Figure 8C
Figure 8D

APPARATUS AND METHOD FOR BURN-IN BOARD ALIGNMENT AND SEALING BETWEEN CHAMBER AND FRAME FOR SEMICONDUCTOR BURN-IN PROCESS

CROSS-REFERENCE TO RELATED APPLICATIONS

This application is a National Phase entry application of International Patent Application No. PCT/SG2021/050828, filed Dec. 29, 2021, which claims the benefit of priority as a continuation-in-part from PCT/SG2020/050791, published as WO/2022/146225, filed Dec. 30, 2020, entitled "APPARATUS, TRANSFER METHOD, CHAMBER AND FRAME FOR SEMICONDUCTOR BURN-IN PROCESS", published as WO/2022/146237, the entire disclosures of which are incorporated herein by reference.

TECHNICAL FIELD

The invention relates to burn-in apparatus for performing burn-in process on the semiconductor devices or integrated circuits, particularly to a burn-in apparatus comprising a burn-in chamber cooperatively operable with one or more interchangeable frames to complete thermal insulation of the chamber and to bring the burn-in boards supported by the frame into alignment to the receiving connectors in the burn-in chamber, methods for transferring at least one frame in and out of the chamber by respectively completing and uncompleting the thermal insulation of the chamber, thereby bringing the burn-in boards into alignment and unalignment to the receiving connectors in the burn-in chamber, methods for transferring a set of burn-in boards being supported on a frame between the burn-in apparatus and at least one other apparatus in the burn-in area, and a burn-in apparatus that incorporates a burn-in chamber and one or more interchangeable frames, both the chamber and the frame having cooperating set of alignment elements and/or cooperating set of thermal insulation side elements.

BACKGROUND

A burn-in apparatus as described in PCT/SG2020/050791 comprises: a burn-in chamber having at least one side opening and at least one base opening; at least one door or cover adapted to close the side opening; at least one interchangeable frame which is movable through the side opening and removably dockable in the chamber to close the base opening, each frame having a thermal insulation base having a first and a second side, and a rack arranged at the first side of the thermal insulation base, wherein when the side opening is closed and each frame is removably docked in the chamber, the thermal insulation base of the frame is arranged at the base opening of the chamber and abuts the chamber to complete a thermal insulation of the chamber, and the rack and the first side of the thermal insulation base are in the chamber while the second side of the thermal insulation base is outside the chamber.

A potential issue may arise if a ground surface, e.g. production floor, on which the burn-in apparatus and the docked interchangeable frame are arranged on may be uneven. A slight angle of unevenness may introduce a misalignment or an alignment error between the interfacing connectors of a set of burn-in boards which are carried on the frame and the receiving connectors which are arranged in the chamber prior to burn-in process. In particular, the interfacing connectors and the receiving connectors may be provided in the form of edge finger and edge connector, plug and socket, header and connector, pin and receptacle, spring or compression probe, or equivalent mating connectors. This error may present in one or more of three forms, e.g. pitch, roll and yaw, and the error is amplified when it is further away from the ground surface which is the origin of unevenness.

As a result of this misalignment or alignment error, the set of burn-in boards carried by the interchangeable frame cannot be inserted correctly into the corresponding set of receiving connectors in the chamber. In the event of forced insertion under misaligned condition, damage to the interfacing connectors of the burn-in boards, the receiving connectors in the chamber, or both, would be inevitable.

Another potential issue relates to thermal sealing between the thermal insulation base of the interchangeable frame and the base opening of the chamber. In the burn-in apparatus as described in PCT/SG2020/050791, a thermal insulation side element may be provided at the base opening of the chamber which is to abut the thermal insulation base of the interchangeable frame to close the base opening of the chamber.

In an example, the thermal insulation side element may be high and/or low temperature insulative material block, e.g. G10, G11, PTFE, Teflon, or any composite material, which may be integrally formed with the base of the chamber or attached thereto, and suitably sized to abut the thermal insulation base of the interchangeable frame. In order to dock the interchangeable frame in the chamber, the frame is progressively moved or inserted into the base opening of the chamber while the thermal insulation base of the frame progressively abuts with the thermal insulation side element of the chamber until the frame is fully docked or inserted such that the base opening of the chamber is closed.

Similarly, unevenness of the ground surface may introduce misalignment and cause difficulty in inserting the interchangeable frame into the base opening of the chamber. Furthermore, abutment between the thermal insulation base of the interchangeable frame and the thermal insulation side element of the chamber may not be completely sealed and this could result in leakages from the chamber to the external or ambient environment, or vice versa, during burn-in process when the side opening is also closed.

In another example, the thermal insulation base of the interchangeable frame and/or the thermal insulation side element of the chamber may optionally include high or low temperature compressible seal or gasket, e.g. silicone compressible or inflatable seal or foam gasket, which is suitably sized to abut with each other with some compression force for complete sealing. During docking process, as the frame is progressively moved into the base opening of the chamber, the thermal insulation base of the frame and/or the thermal insulation side element of the chamber will be progressively compressed and complete the sealing of the base opening of the chamber when the burn-in board frame is fully docked or inserted in the chamber.

In this example, yet again, the unevenness of the ground surface may introduce misalignment and cause difficulty in inserting the interchangeable frame into the base opening of the chamber. Moreover, the progressive compression of the thermal insulation side element of the burn-in chamber with the thermal insulation base of the frame produces resistance and friction during docking and undocking. This resistance and friction would cause wear and tear to the thermal insulation base of the frame as well as the thermal insulation side element of the chamber. This wear and tear of the thermal insulation base and/or the thermal insulation side element would also result in leakages from the chamber to the external or ambient environment, or vice versa, during burn-in process when the side opening is also closed.

While it is possible to modify or level a ground surface under the burn-in chamber by flattening the ground surface or adding a platform to the ground surface, this is not a simple or convenient solution. Whenever a new burn-in chamber is installed or an existing burn-in chamber is moved to a new location, it would be necessary to repeat the ground surface modification or levelling at the new location. This is a cumbersome activity and results in unnecessary production downtime.

SUMMARY

According to one aspect, a burn-in apparatus for performing burn-in process on semiconductor devices or integrated circuits is provided. The apparatus comprises:

a burn-in chamber having at least one side opening, at least one base opening, and a set of receiving connectors arranged in the chamber;

at least one door or cover adapted to close the side opening;

at least one interchangeable frame which is movable through the side opening and removably dockable in the chamber to close the base opening, each frame having a thermal insulation base having a first and a second side, and a rack arranged at the first side of the thermal insulation base and supporting a set of burn-in boards; and a plurality of cooperating alignment elements respectively arranged at the frame and the chamber, and configured to progressively and movably couple to each other to lift the frame to bring the set of burn-in boards that are supported by the rack into alignment for insertion into the set of receiving connectors in the chamber and to close the base opening by arranging at least the thermal insulation base of the frame in the base opening of the chamber, thereby removably docking the frame in the chamber, wherein when the side opening is closed and each frame is removably docked in the chamber, a thermal insulation of the chamber is completed thereby defining a thermal zone configured to be subject to burn-in condition provided by the chamber, such that the rack, the set of burn-in boards and the first side of the thermal insulation base are in the thermal zone while the second side of the thermal insulation base is outside the thermal zone.

According to another aspect, a method comprises:

transferring a set of burn-in boards into a chamber by moving at least one frame into the chamber through a side opening thereof, wherein each frame includes a thermal insulation base and a rack which is arranged at a first side of the thermal insulation base and supports the set of burn-in boards, wherein the chamber includes a set of receiving connectors arranged therein, wherein a plurality of cooperating alignment elements are respectively arranged at the frame and the chamber;

completing a thermal insulation of the chamber thereby defining a thermal zone configured to be subject to burn-in temperature provided by the chamber, including:

progressively and movably coupling the cooperating alignment elements to each other to lift the frame to bring the set of burn-in boards on the rack into alignment for insertion into the set of receiving connectors in the chamber and to close the base opening of the chamber by arranging at least the thermal insulation base of the frame in the base opening of the chamber, thereby removably docking the frame in the chamber, inserting the set of burn-in boards into the set of receiving connectors in the chamber, and closing the side opening such that the rack, the set of burn-in boards, and the first side of the thermal insulation base are in the thermal zone while a second side of the thermal insulation base is outside the thermal zone; and performing burn-in process on semiconductor devices arranged in the set of burn-in boards.

According to another aspect, the burn-in chamber of the above-described burn-in apparatus is provided.

According to another aspect, the frame of the above-described burn-in apparatus is provided.

In some embodiments of the above-described aspects, each frame further includes wheels which are manual or power assisted or adapted to be used with an autonomous guided vehicle (AGV), or a non-wheel arrangement which is adapted to be used with the AGV, wherein the wheels or the non-wheel arrangement is arranged at the second side of the thermal insulation base, wherein the cooperating alignment elements are configured to lift the wheels off a ground surface or lift the non-wheel arrangement off the AGV.

In some embodiments of the above-described aspects, a plurality of cooperating thermal insulation side elements are respectively arranged at the frame and the chamber, and respectively having complementary characteristics configured to provide a clearance gap between the cooperating thermal insulation side elements when the cooperating thermal insulation side elements partially overlap each other and further configured to provide an abutting fit between the cooperating thermal insulation side elements when the cooperating thermal insulation side elements substantially or fully overlap each other.

In some embodiments of the above-described aspects, the wheels of the frame include at least front wheels and rear wheels; the cooperating alignment elements include rollers comprising at least front rollers and rear rollers, and further include at least one roller-receiving support; the front rollers and the rear rollers are configured to respectively lift the front wheels and the rear wheels when the front rollers and the rear rollers are respectively coupled to the roller-receiving support; the cooperating alignment elements are arranged either above the cooperating thermal insulation side elements such that when the side opening is closed and each frame is removably docked in the chamber, the cooperating alignment elements are arranged inside the thermal zone, or below the cooperating thermal insulation side elements such that when the side opening is closed and each frame is removably docked in the chamber, the cooperating alignment elements are arranged outside the thermal zone.

In some embodiments of the above aspects, the rollers are arranged at the frame and the roller-receiving support is arranged at the chamber; or the rollers are arranged at the chamber and the roller-receiving support is arranged at the frame.

In some embodiments of the above aspects, the cooperating alignment elements and/or the cooperating thermal insulation side elements are arranged proximal to or at the thermal insulation base of the frame and the base opening of the chamber.

BRIEF DESCRIPTION OF DRAWINGS

FIGS. 1A and 1B are plan views wherein FIG. 1A shows interfacing connectors of a burn-in board prior to their insertion into receiving connectors of a burn-in chamber, and FIG. 1B shows the interfacing connectors after insertion into the receiving connectors;

FIGS. 1C and 1D are side views corresponding to FIGS. 1A and 1B respectively;

FIG. 5A is a front view of an undocked position wherein the chamber of FIG. 3B is unoccupied;

FIG. 5B is a partial close-up view of FIG. 5A;

FIG. 5C is a front view of a docked position wherein the chamber of FIG. 3B is docked with the interchangeable frame of FIG. 3A;

FIG. 5D is a partial close-up view of FIG. 5C;

FIG. 8A is a front view of an undocked position wherein the chamber of FIG. 6B is unoccupied;

FIG. 8B is a partial close-up view of FIG. 8A;

FIG. 8C is a front view of a docked position wherein the chamber of FIG. 6B is docked with the interchangeable frame of FIG. 6A;

FIG. 8D is a partial close-up view of FIG. 8C;

DETAILED DESCRIPTION

Figure 2A:
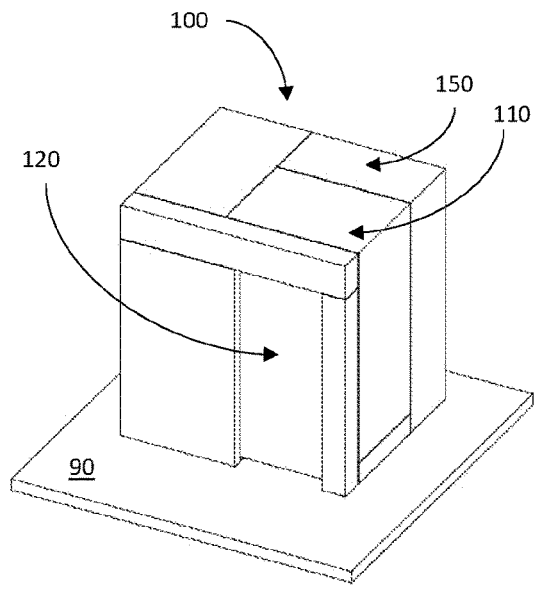
FIG. 2A is a perspective view of a burn-in chamber with its door closed.

In the following description, numerous specific details are set forth in order to provide a thorough understanding of various illustrative embodiments of the invention. It will be understood, however, to one skilled in the art, that embodiments of the invention may be practiced without some or all of these specific details. In other instances, well known process operations have not been described in detail in order not to unnecessarily obscure pertinent aspects of embodiments being described.

Embodiments described in the context of one of the methods, apparatus, or systems are analogously applicable to the other methods, apparatus, or systems. Similarly, embodiments described in the context of a method are analogously applicable to an apparatus or system, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the drawings, like reference numerals refer to same or similar functionalities or features throughout the several views. The particular arrangements shown in the drawings should not be viewed as limiting. It should be understood that other embodiments can include more or less of each element shown in a given figure. Some of the illustrated elements can be combined or omitted.

In the context of various embodiments, including examples and claims, the articles "a", "an" and "the" as used with regard to a feature or element include a reference to one or more of the features or elements. The terms "comprising," "including," "having", and their variations are intended to be open-ended and mean that there may be additional features or elements other than the listed ones. The term "and/or" includes any and all combinations of one or more of the associated listed items. Identifiers such as "first", "second" and "third" are used merely as labels, and are not intended to impose numerical requirements on their objects, nor construed in a manner imposing any relative position or time sequence between limitations. The term "coupled" may refer to physically coupling, electrically coupling, and/or communicably coupling. The term "coupled" when applied to two objects may refer to the two objects being coupled directly or indirectly through a third object. The term "arranged at" may include references to "coupled to". The term "support" or "supporting" when applied to two objects may refer to a first object being supported directly by a second object or indirectly through a third object. The term "above" is not limited to "directly above"; the term "below" is not limited to "directly below". The term "abut" and its related terms when applied to two objects may refer to arranging the two objects in contact or compressive contact with each other whether such contact or compressive contact is direct or indirect. The phrase "arranged on" and its related terms when applied to two objects may refer to arranging a first object in contact with or coupled to a second object; such contact may be direct or indirect; such coupling may be direct or indirect via at least a third object which may be coupled to or an integral part of the first and/or the second object.

A burn-in apparatus comprises of a burn-in chamber with an incomplete base which is adapted to be completed and thermally insulated in cooperation with a thermal insulation base of at least one interchangeable frame which is adapted to be removably moved into and docked in the burn-in chamber. More particularly, the burn-in apparatus comprises a burn-in chamber (alternatively referred to as "chamber") having at least one side opening and at least one base opening, and at least one door or cover adapted to close or seal the side opening and provide thermal insulation thereto. The base opening is closable or sealable by at least a thermal insulation base of a frame when the frame is moved into the chamber and docked therein. When both side opening and base opening are closed, thermal insulation of the burn-in chamber is completed thereby defining a thermal zone which is in the chamber and configured to be subject to burn-in condition, e.g. temperature, provided by the chamber. This thermal zone corresponds to an enclosure in which burn-boards undergo burn-in process and which may be defined at least by the closed base opening, closed side opening and remaining portions of the chamber. The remaining portions of the chamber, i.e. other than the aforementioned side opening and base opening, may be thermally insulated and include a back panel having a set of receiving connectors which are to receive or couple to a set of burn-in boards respectively.

The burn-in apparatus may be coupled to or cooperate with at least one burn-in driver or test apparatus which is adapted to be connected to burn-in boards on a docked frame via the set of receiving connectors in the chamber and to provide and/or receive power and/or electrical signals to the semiconductor devices arranged in and/or connected to the burn-in boards. The burn-in driver may be arranged in a driver section or cabinet which may be external of the chamber but may be arranged adjacent to the chamber. The chamber is adapted to accommodate at least one frame supporting burn-in boards. The complete assembly of the burn-in apparatus, comprising the chamber and the frame, and burn-in driver forms the burn-in system.

The frame provides a carrier of burn-in boards and semiconductor devices to transport them at least to and from the burn-in chamber and hold them during burn-in process. The frame is suitably constructed and dimensioned to be removably moved into and docked in the burn-in chamber, and interchange with another similar frame. Accordingly, the frame may alternatively be referred to as interchangeable frame, transportation frame, removable frame, dockable frame, or an appropriate combination thereof. The frame comprises at least one rack, at least one thermal insulation base (alternatively referred to as "insulation base") suitably located at the frame, e.g. bottom of the frame, such that when the frame is docked in the chamber, the insulation base of the frame is arranged in the base opening of the chamber, e.g. abuts at least a portion of the chamber or its base frame which at least partially defines the base opening of the chamber, and thereby closing the base opening and providing thermal insulation to the base opening of the chamber. The insulation base includes a first side and a second side which may be opposite, or transverse, or otherwise appropriately oriented to the first side, e.g. same or different direction. The rack is arranged at the first side of the insulation base, i.e. coupled to the insulation base and/or frame. Consequently, when the insulation base is arranged at the base opening of the chamber, the first side of the insulation base and the rack are arranged in/inside the chamber or thermal zone and therefore subject to the burn-in temperature in the chamber during burn-in process, while the second side of the insulation base is arranged outside the chamber or thermal zone, e.g. in the ambient environment or within a housing of the burn-in apparatus which is exterior of the chamber, and therefore not subject to the burn-in temperature in the chamber during burn-in process.

Cooperating alignment elements, e.g. at least first and second alignment elements, are respectively arranged at the frame and the chamber, or vice versa, and configured to progressively and movably coupled to each other while the frame is being moved into or docked in the chamber to progressively lift the frame. After the cooperating alignment elements are substantially or fully coupled to each other, the frame is lifted, hence the set of burn-in boards supported on the rack of the frame is brought into alignment, e.g. a desired alignment position, for subsequent insertion of the set of burn-in boards, e.g. their interfacing connectors, into the set of receiving connectors in/of the chamber and, furthermore, the base opening of the chamber is closed due to at least the thermal insulation base docked therein. To illustrate this alignment position, FIGS. 1A and 1C show a burn-in board 220 and its interfacing connectors 221, e.g. edge fingers, etc., in alignment to receiving connectors 119 in the chamber prior to inserting the interfacing connectors 221 of the burn-in board 220 into the receiving connectors 119 in the chamber. FIGS. 1B and 1D show the interfacing connectors 221 of the burn-in board 220 inserted into the receiving connectors 119 of the chamber thereby conductively coupling the burn-in board to the burn-in driver or test apparatus for burn-in process. Accordingly, alignment of the set of burn-in boards to the set of receiving connectors generally refers to a co-planar or substantially co-planar arrangement of at least the interfacing connectors of the burn-in boards and receiving connectors in the chamber to facilitate proper insertion of the interfacing connectors of the burn-in boards, e.g. edge fingers, etc., into the receiving connectors arranged in the chamber. An example of cooperating alignment elements includes rollers arranged at the frame and at least one complementary roller-receiving support arranged at the chamber, or vice versa. Another example of cooperating alignment elements includes a slide rail assembly having a fixed rail and a complementary movable sliding device which are arranged at the chamber and the frame respectively, or vice versa.

Cooperating thermal insulation side elements, e.g. at least first and second thermal insulation side elements, may be respectively arranged at the frame and the chamber, or vice versa, and provided with complementary characteristics, e.g. gradients, shapes, dimensions, which are configured to provide a clearance gap between the cooperating thermal insulation side elements when they partially overlap each other during docking and to provide an abutting fit therebetween when they substantially or fully overlap each other upon docking to provide thermal sealing. Progressive coupling of the cooperating alignment elements would result in progressive overlap of the cooperating thermal insulation side elements. Examples of complementary gradients and/or shapes may include a set of complementary trapezoidal profiles, a set of complementary triangular profiles, and a set of complementary convex and concave profiles.

FIGS. 2A to 2D show a burn-in apparatus 100 according to one embodiment of the invention. The burn-in apparatus 100 comprises a burn-in chamber 110 and a burn-in driver section or cabinet 150 which may be arranged adjacent to a back panel 118 of the burn-in chamber 110. The burn-in driver section or cabinet 150 may house burn-in driver or test apparatus, and associated components or circuitry. The back panel 118 comprises a set of receiving connectors 119 which are coupled to the burn-in driver or test apparatus, and adapted to receive a set of burn in boards 220 or their interfacing connectors 221. The chamber 110 provides at least two openings, e.g. base opening 112 and side opening 114. The base opening 112 may be provided at the bottom of the chamber 110, e.g. chamber's base frame 111. The chamber 110, e.g. chamber base frame 111, may comprise at least one thermal insulation side element 116 (see FIGS. 3B and 6B) provided at least partially along the base opening 112 to provide at least one of the cooperating thermal insulation side elements. The thermal insulation side element 116 may be an integral part of the chamber 110 or provided as at least one separate element coupled to the chamber 110. Dimensions defined by the thermal insulation side element 116 and the base opening 112 are adapted to ensure the thermal insulation side element 116 abuts the thermal insulation side element 216 (see FIGS. 3A and 6A) of a compatible frame 200 to close the base opening 112 when the frame is moved into and docked in the chamber 110. The side opening 114 may be provided at a lateral side of the chamber 110 and may be arranged in fluid communication with the base opening 112, i.e. base opening 112 and side opening 114 intersect. Lateral side may refer to non-top or non-bottom side, and may be transverse to the bottom side. The side opening 114 allows transfer of the frame, e.g. loaded frame with burn-in boards, into and out of the chamber 110. The side opening 114 is closable by at least one door 120 or cover which may be movably coupled, e.g. by hinge, slider, or equivalents, to the chamber 110 or burn-in apparatus 100, or by at least one door or cover which is detached or separate from the chamber 110 or burn-in apparatus 100. The door 120 when closed is adapted to provide thermal insulation to the side opening 114, however, even if the side opening 114 is closed by the door 120 while the compatible frame 200 is absent from or moved out from the chamber 110, thermal insulation of the chamber 110 is still incomplete due to the unfilled or uncovered base opening 112. The base opening 112 and the side opening 114 allow fluid communication between an interior of the chamber 110 and an exterior of the chamber 110 or ambient environment when at least one of them is not closed. The chamber 110 is arranged on a ground surface 90 (e.g. in contact with or coupled to the ground surface 90) via supporting foot mounts or adjustable supporting foot mounts extending from the chamber's base frame 111.

Figure 2B:
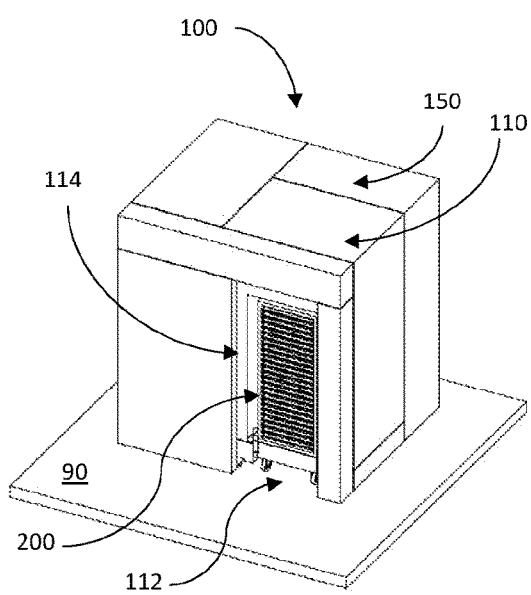
FIG. 2B is a perspective view of the burn-in chamber of FIG. 2A with its door opened and a loaded interchangeable frame docked therein.
Figure 2C:
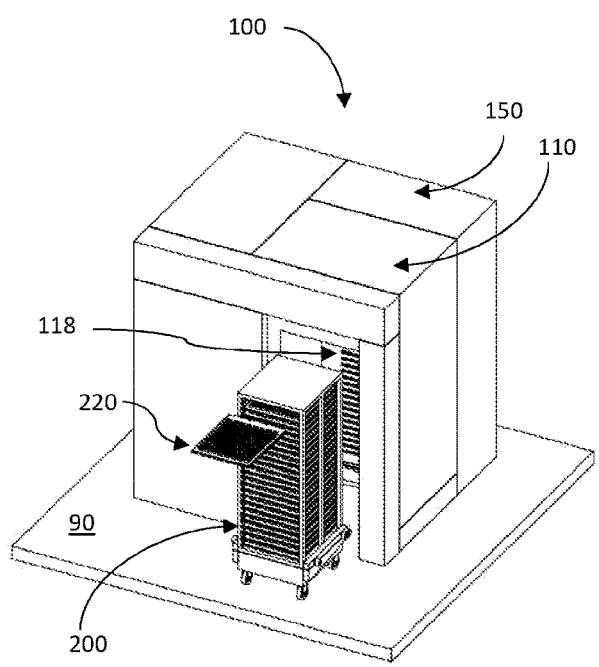
FIG. 2C is a perspective view of the burn-in chamber of FIG. 2A with its door opened and the loaded interchangeable frame undocked therefrom.
Figure 2D:
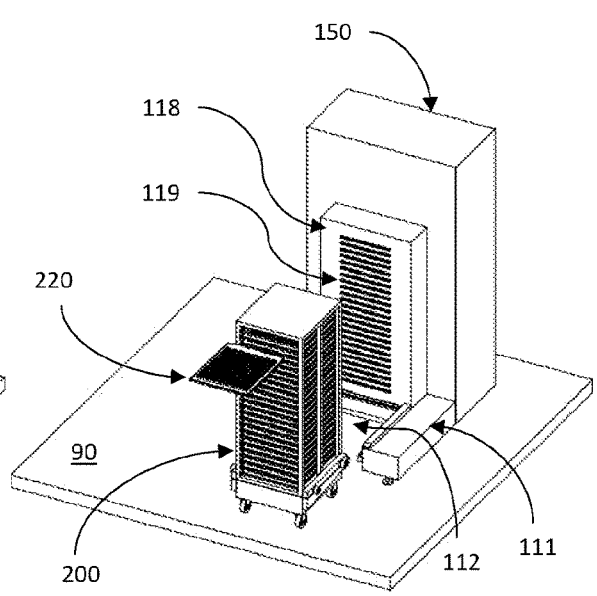
FIG. 2D shows FIG. 2C with parts of the burn-in chamber removed to show the chamber's back panel and its set of receiving connectors.

FIGS. 2B to 2D show a frame 200 which is adapted to be removably docked in the chamber 110. The frame 200 comprises a rack 210 (see FIGS. 3A and 6A) for supporting one or more burn-in boards (alternatively referred to as a set of burn-in boards 220) which may be stacked or arranged in other configurations. The rack 210 may comprise other structural elements for directly or indirectly supporting the burn-in boards. The frame 200 further comprises a thermal insulation base 212 (see FIGS. 3A and 6A) which may partially or fully form a bottom of the rack 210 or frame 200. In context of FIGS. 2B to 2D, the thermal insulation base 212 has a first side, e.g. top side, and a second side, e.g. bottom side. Although the first side and the second side may be mutually opposite as shown in FIGS. 2B to 2D, they may be mutually transverse or arranged on non-opposite sides in other examples as long as during burn-in process or when the frame 200 is docked in the chamber 110, the first side is arranged inside the chamber 110 or thermal zone while the second side is arranged outside the chamber 110 or thermal zone. The frame 200 may further comprise wheels 230 (see FIGS. 3A and 6A) arranged at the second side of the insulation base 212, e.g. rotatably coupled to the insulation base 212 and/or rack 210. Accordingly, during burn-in process or when the frame 200 is docked in the chamber 110, the wheels 230 are arranged outside the chamber 110 or thermal zone. The wheels 230 may be electrostatic discharge (ESD) safe or non-ESD safe wheels which may be manual, power assisted, or adapted to be used with autonomous guided vehicle (AGV). The wheels 230 may comprise front wheels 2301 and rear wheels 2302 (see FIGS. 3A and 6A). The terms "front" and "rear" may be understood in context of a docking sequence of the frame 200 in relation to a docking direction 250, i.e. the front wheels 2301 would be first to move into the chamber 110 during docking while the rear wheels 2302 would move into the chamber 110 thereafter. A combination of the frame 200 and its wheels 230 may be referred to as a trolley.

The frame 200 may further comprise electronic circuitry (not shown) which are arranged at the second side of the insulation base 212. Accordingly, during burn-in process or when the frame 200 is docked in the chamber 110, the electronic circuitry is arranged outside the chamber 110 or a thermal zone and therefore unaffected or not subject to at least the temperature condition in the chamber 110 during burn-in process. The electronic circuitry may include communication circuitry, e.g. transmitter, receiver, adapted to send and/or receive signals to one or more remote devices, e.g. communication device, by wired or wireless connection.

The electronic circuitry may further include at least one sensor, computing processor or microprocessor, and/or memory device for storing instructions executable by the computing processor or microprocessor which may be communicably coupled to the communication circuitry, sensor, and/or memory device. The signals may provide information about the frame 200 being docked in the chamber 110, burn-in boards and/or semiconductor devices being supported by the particular frame 200. Such information may include location and/or characteristics of the particular frame 200, burn-in boards and/or semiconductors being supported by the particular frame 200.

When the frame 200 is removably docked in the chamber 110 (FIG. 2B), the frame 200 is lifted to be arranged on the chamber 110 (e.g. in contact with or coupled to the chamber base frame 111 or another structure which is coupled to or is a part of the chamber 110) hence a set of burn-in boards supported by the frame 200 and/or its rack 210 are brought into alignment to a set of receiving connectors 119 arranged on a back panel 118 of the chamber 110. With this aligned arrangement, interfacing connectors 221 of burn-in boards may be properly inserted into the receiving connectors 119 (e.g. see FIGS. 1A to 1D).

Figure 3A:
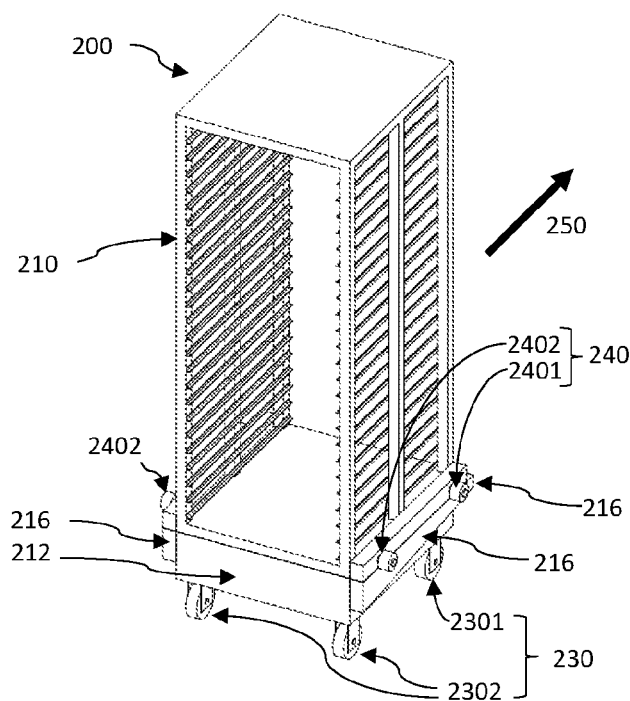
FIG. 3A shows a perspective view of an interchangeable frame having rollers arranged above its thermal insulation side elements which are configured to cooperate with the chamber's thermal insulation side elements of FIG. 3B, according to an embodiment.
Figure 3B:
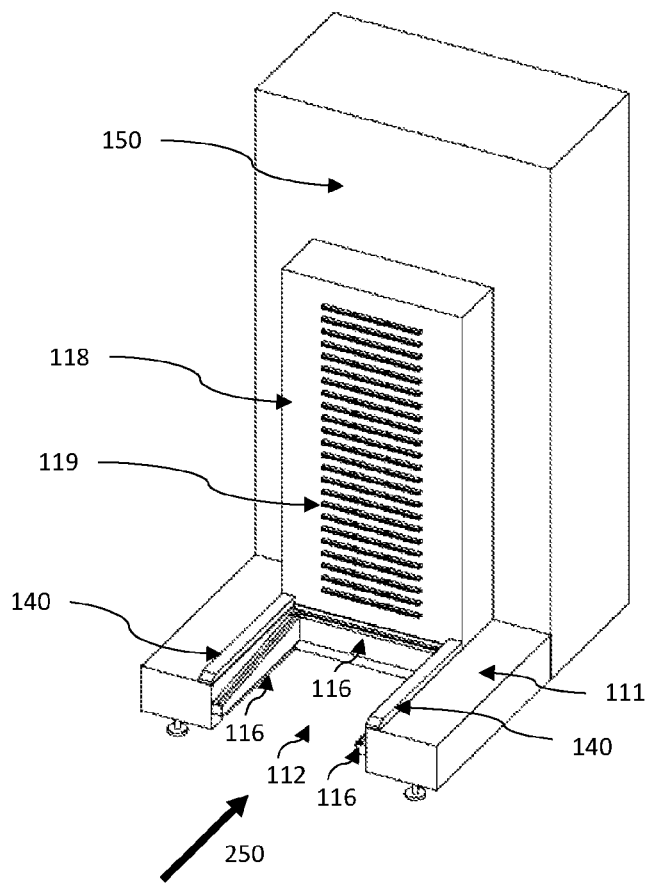
FIG. 3B shows roller-receiving supports and thermal insulation side elements provided at a burn-in chamber which are configured to cooperate with the rollers and thermal insulation side elements of FIG. 3A.

FIGS. 3A and 3B show an interchangeable frame 200 and a partial view of an interior of a burn-in chamber 110 respectively, according to an embodiment. At the frame 200 having four sides, front rollers 2401 and rear rollers 2402 (collectively 240) are arranged thereon, e.g. directly or indirectly coupled to the frame 200. The terms "front" and "rear" may be understood in context of a docking sequence of the frame 200 in relation to a docking direction 250, i.e. the front rollers 2401 (or first rollers) would be first to movably couple to roller-receiving supports 140 of the chamber 110 during docking while the rear rollers 2402 (or second rollers) would movably couple to the roller-receiving supports 140 thereafter. The term "rollers" may refer to wheels, ball bearings, rotary device, sliding device, or equivalent, which facilitate motion of the frame 200 on the chamber 110, e.g. its base frame 111. The rollers 2401, 2402 may be arranged along opposite sides of the frame 200, e.g. proximal to its thermal insulation base 212. The rollers 2401, 2402 may be arranged at a suitable distance from front and rear sides of the frame 200 to reduce or minimize pitch motion of the frame 200 and instability during docking. At the frame 200, thermal insulation side elements 216 are also arranged thereon, e.g. directly or indirectly coupled to the thermal insulation base 212 of the frame 200, and may be arranged along opposite or three sides of the frame 200. At least one of the thermal insulation side elements 216 may taper, i.e. towards reduced thickness, from the frame's rear side to its front side, i.e. along a direction taken from the rear rollers 2402 to the front rollers 2401. The frame's thermal insulation side elements 216 may be arranged below the frame's front and rear rollers 2401, 2402.

At the chamber 110, roller-receiving supports 140 and thermal insulation side elements 116 may be arranged along opposite or three sides of the base opening 112 of the chamber 110, e.g. directly or indirectly coupled to the chamber 110 or its base frame 111 which defines the base opening 112 having an inner side proximal to the receiving connectors 119 in the chamber 110, opposite lateral sides, and an outer side distal (less proximal) from the receiving connectors 119. At least one of the thermal insulation side elements 116 may taper, i.e. towards reduced thickness, from the base opening's inner side to its outer side (i.e. along a direction taken from an end of the roller-receiving support 140 which is proximal to the receiving connectors 119 to another end of the roller-receiving support 140 which is distal (less proximal) from the receiving connectors 119). The chamber's thermal insulation side elements 116 may be arranged below its roller-receiving supports 140.

Collectively, the front rollers 2401 and the rear rollers 2402 as well as the roller-receiving supports 140 provide cooperating alignment elements which are operable to lift the frame 200 to bring a set of burn-in boards 220 supported on a frame 200 into alignment with a set of receiving connectors 119 in the chamber 110. Collectively, the frame's thermal insulation side elements 216 and the chamber's thermal insulation side elements 116 provide cooperating thermal insulation side elements having complementary characteristics, e.g. gradients and shapes, which are operable to facilitate unimpeded relative motion or progressive coupling of the cooperating alignment elements 140, 240 along the docking direction 250 by providing a clearance gap when the cooperating thermal insulation side elements 116, 216 are partially overlapping each other and further operable to impede further or increased overlap by providing an abutting fit when the cooperating thermal insulation side elements 116, 216 are substantially or fully overlapping.

Figures 4A, 4B:
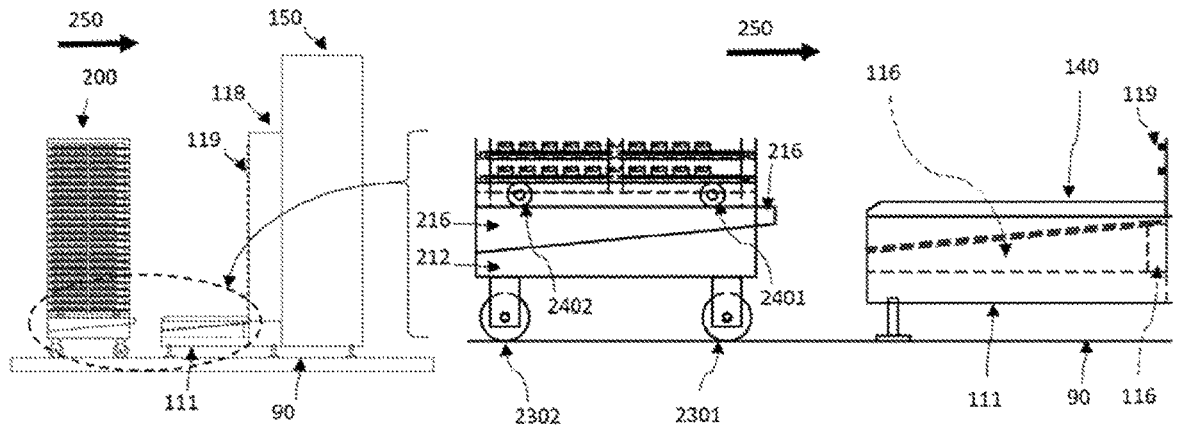
FIG. 4A shows a side view of the interchangeable frame of FIG. 3A which is undocked from the burn-in chamber of FIG. 3B, i.e. in an undocked position.
FIG. 4B shows a partial close-up view of FIG. 4A.
Figures 4C, 4D:
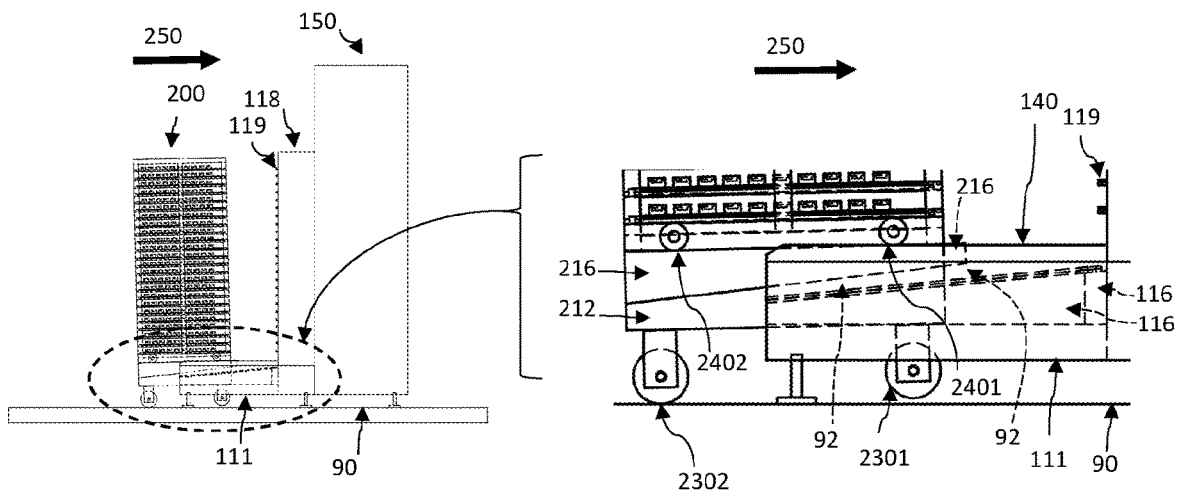
FIG. 4C shows a side view of the interchangeable frame of FIG. 3A which is partially docked in the burn-in chamber of FIG. 3B, i.e. in a partially docked position.
FIG. 4D shows a partial close-up view of FIG. 4C.
Figures 4E, 4F:
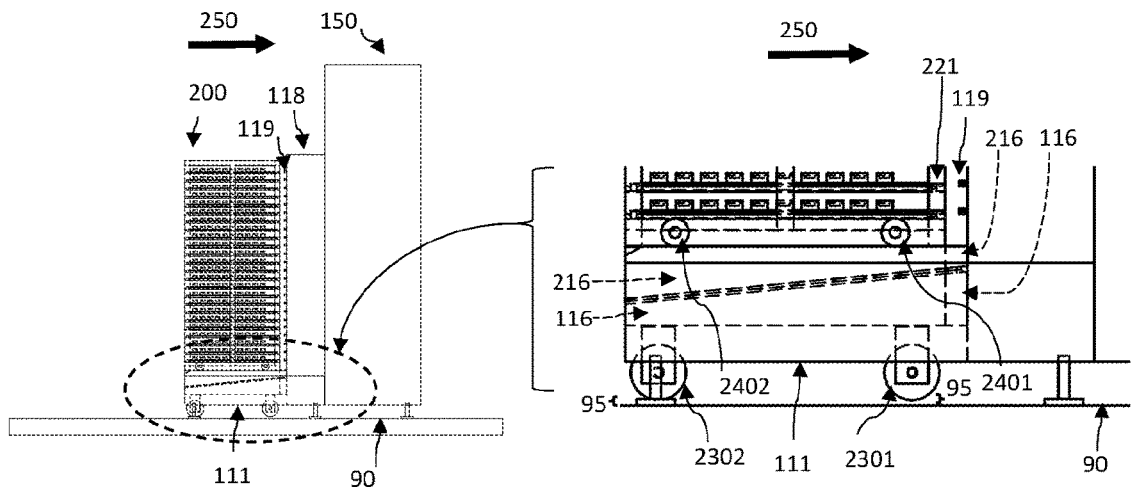
FIG. 4E shows a side view of the interchangeable frame of FIG. 3A which is fully docked in the burn-in chamber of FIG. 3B, i.e. in a docked or fully docked position.
FIG. 4F shows a partial close-up view of FIG. 4E.

FIGS. 4A, 4C, 4E show side views of an interchangeable frame 200 of FIG. 3A which are respectively in undocked position, partially docked position, and docked or fully docked position. FIGS. 4B, 4D, 4F are partial close-up views of FIGS. 4A, 4C, 4E respectively. Accordingly, the motion sequence of the frame 200 shown by FIGS. 4A, 4C, 4E and FIGS. 4B, 4D, 4F each defines a docking direction 250.

In the undocked position (see FIGS. 4A and 4B), the frame 200 is arranged on a ground surface 90 (e.g. in contact with or coupled to the ground surface 90) which the burn-in chamber 110 may also be arranged on. The front rollers 2401 and rear rollers 2402 are free-hanging (e.g. not in contact with nor coupled to roller-receiving support 140) while the front wheels 2301 and rear wheels 2302 are arranged on the ground surface 90. Correspondingly, FIGS. 5A and 5B show a front view of an undocked position, e.g. the unoccupied chamber 110 having a set of receiving connectors 119 arranged at its back panel 118, roller-receiving supports 140 arranged along two opposite sides of its base frame 111, and thermal insulation side elements 116 arranged along three sides of its unoccupied base opening 112. In FIGS. 5A and 5B, the roller-receiving supports 140 are arranged above the thermal insulation side elements 116.

In the partially docked position (see FIGS. 4C and 4D), the frame 200 is partially arranged on the chamber 110 and partially arranged on the ground surface 90. In particular, the front rollers 2401 are movably coupled to the roller-receiving supports 140 of the chamber 110 such that the front wheels 2301 of the frame 200 are lifted off the ground surface 90; the rear rollers 2402 are free-hanging such that the rear wheels 2302 of the frame 200 remain arranged on the ground surface 90. In this partially docked position, the cooperating thermal insulation side elements 116, 216 partially overlap each other. Due to their complementary characteristics, the cooperating thermal insulation side elements 116, 216 are spaced apart by a clearance gap 92, e.g. vertical gap, which allows further unimpeded relative motion of the cooperating thermal insulation side elements 116, 216 in the docking direction 250 to increase their overlap.

In the docked position (alternatively referred to as fully docked position, see FIGS. 4E and 4F), the frame 200 is arranged on the chamber 110. In particular, the front rollers 2401 and the rear rollers 2402 are movably coupled to the roller-receiving supports 140 of the chamber 110 such that the front wheels 2301 and the rear wheels 2302 are lifted off the ground surface 90 and hence are no longer arranged on the ground surface 90. In this docked position, the cooperating thermal insulation side elements 116, 216 substantially or fully overlap each other. Due to their complementary characteristics, the clearance gap 92 between the cooperating thermal insulation side elements 116, 216 is substantially reduced or eliminated such that the cooperating thermal insulation side elements 116, 216 abut each other to provide a thermal seal therebetween. Correspondingly, FIGS. 5C and 5D show a front view of the docked position, i.e. a set of receiving connectors 119 in the chamber 110 are aligned to a set of burn-in boards 220 supported on the frame 200, the front rollers 2401 and the rear rollers 2402 of the frame 200 are movably coupled to the roller-receiving supports 140 of the chamber 110, thermal insulation side elements 116 of the chamber abut the cooperating thermal insulation side elements 216 of the frame 200, and the frame 200 is arranged on the chamber 110 such that the front wheels 2301 and the rear wheels 2302 are lifted (see FIGS. 4F and 5D for a gap 95 between wheels 230 and ground surface 90). In the docked position, the front rollers 2401 and the rear rollers 2402, the thermal insulation side element 216 of the frame 200, and the roller-receiving support 140 of the chamber 110 are arranged inside a thermal zone.

In the embodiment illustrated in FIGS. 3A, 3B, 4A to 4F, 5A to 5D, the frame's rollers 2401, 2402 are arranged above the frame's thermal insulation side elements 216, some of which taper, i.e. towards reduced thickness, from the frame's rear side to its front side while the chamber's roller-receiving supports 140 are arranged above the chamber's thermal insulation side elements 116, some of which taper, i.e. towards reduced thickness, from the base opening's inner side to its outer side. When the frame 200 is in the docked position, the cooperating alignment elements 140, 240 are above the thermal insulation side elements 116, 216.

Figure 10A:
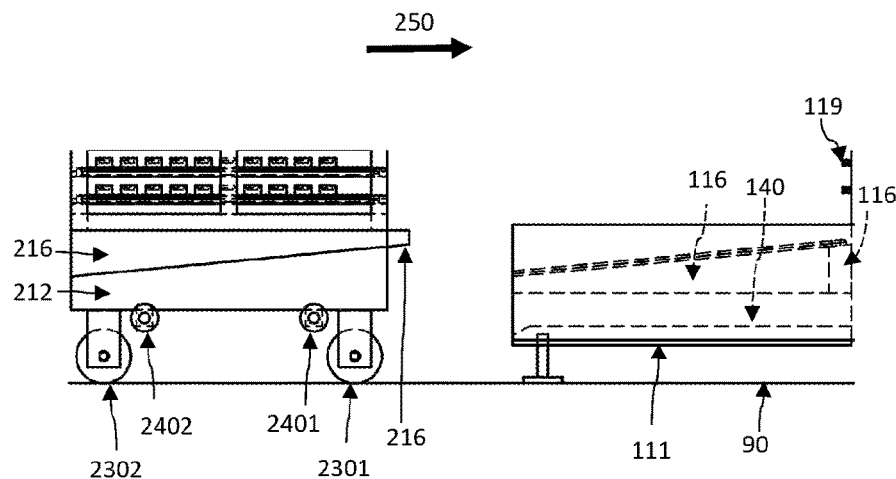
FIG. 10A shows a partial close-up side view of an interchangeable frame, according to another embodiment, which is undocked from a burn-in chamber, i.e. in an undocked position.
Figure 10B:
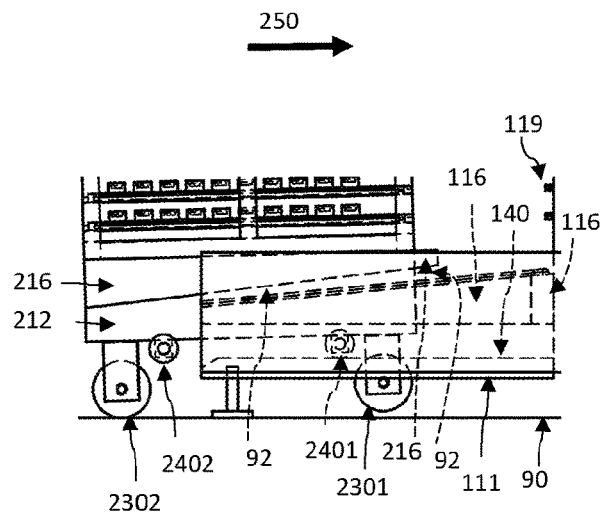
FIG. 10B shows a partial close-up side view of the interchangeable frame of FIG. 10A which is partially docked in the burn-in chamber, i.e. in a partially docked position.
Figure 10C:
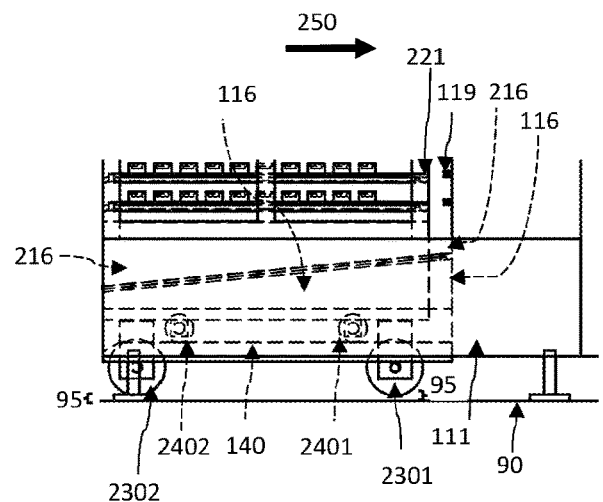
FIG. 10C shows a partial close-up side view of the interchangeable frame of FIG. 10A which is fully docked in the burn-in chamber, i.e. in a docked or fully docked position.

In a modified embodiment illustrated in FIGS. 10A to 10C in which the tapered thermal insulation side elements 116, 216 remain the same as in FIGS. 3A, 3B, 4A to 4F, 5A to 5D (hence their description will not be repeated), the frame's rollers 2401, 2402 are modified to be arranged below the frame's thermal insulation side element 216 while the chamber's roller-receiving supports 140 are modified to be arranged below the chamber's thermal insulation side element 116. FIGS. 10A and 10B show the frame in an undocked position and a partially docked position respectively. When the frame 200 is in the docked position (see FIG. 10C), the cooperating alignment elements 140, 240 are arranged below the cooperating thermal insulation side elements 116, 216.

Figure 6A:
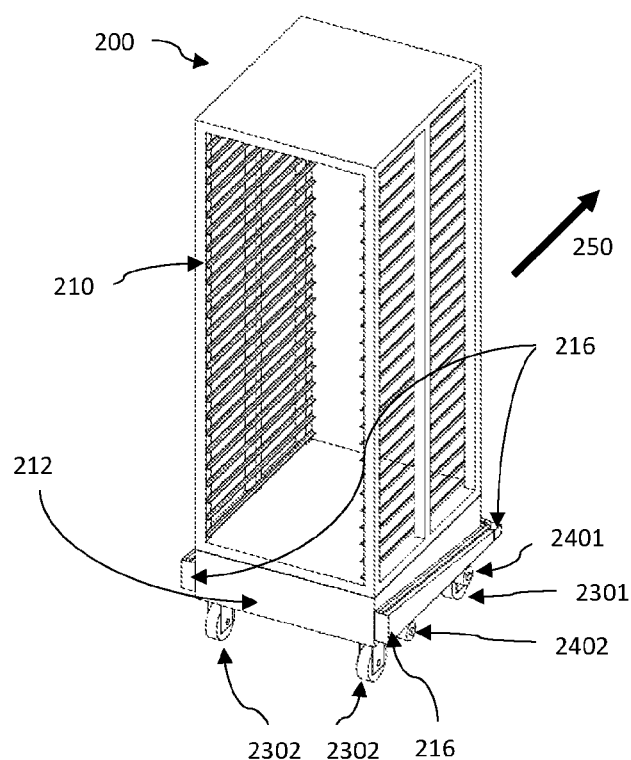
FIG. 6A shows a perspective view of an interchangeable frame having rollers arranged below its thermal insulation side elements which are configured to cooperate with the chamber's thermal insulation side elements of FIG. 6B, according to an embodiment.
Figure 6B:
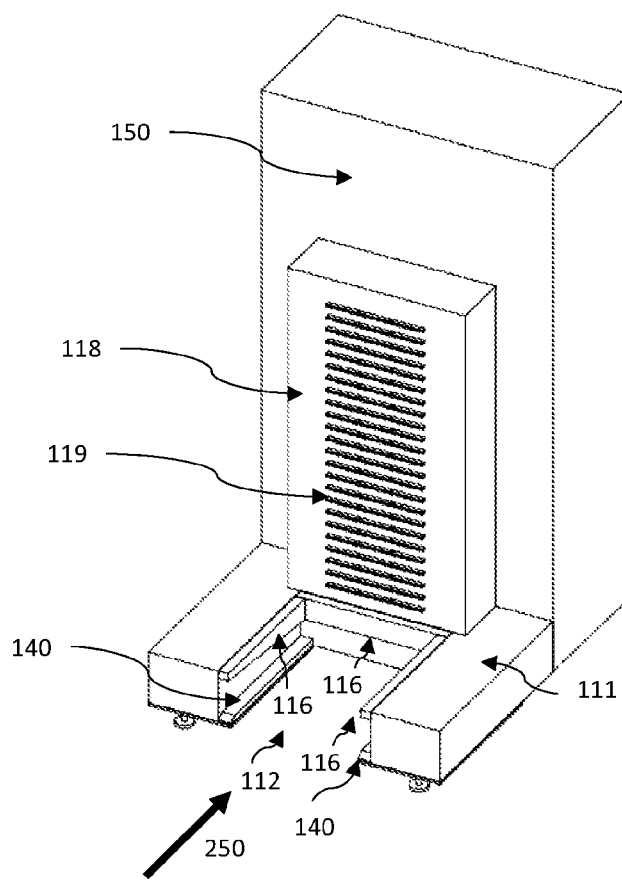
FIG. 6B shows roller-receiving supports and thermal insulation side elements provided at a burn-in chamber which are configured to cooperate with the rollers and thermal insulation side elements of FIG. 6A.

FIGS. 6A and 6B show an interchangeable frame 200 and a partial view of an interior of a burn-in chamber 110 respectively, according to an embodiment. Similar to the frame 200 of FIG. 3A, front rollers 2401, rear rollers 2402, and thermal insulation side elements 216 are arranged at the frame 200. However, in FIG. 6A, the frame's thermal insulation side elements 216 are arranged above the front rollers 2401 and rear rollers 2402; at least one of the frame's thermal insulation side elements 116 may taper, i.e. towards reduced thickness, along a direction from the rear rollers 2402 to the front rollers 2401. Similar to the chamber 110 of FIG. 3B, roller-receiving supports 140 and thermal insulation side elements 116 are arranged at the chamber 110. However, the chamber's thermal insulation side elements 116 may be arranged above chamber's roller-receiving supports 140; at least one of the chamber's thermal insulation side elements 116 may taper, i.e. towards reduced thickness, from the base opening's inner side to its outer side. Collectively, the front rollers 2401 and the rear rollers 2402 as well as the roller-receiving supports 140 provide cooperating alignment elements. Collectively, the frame's thermal insulation side elements 216 and the chamber's thermal insulation side elements 116 provide cooperating thermal insulation side elements having complementary characteristics, e.g. gradients and shapes.

Figures 7A, 7B:
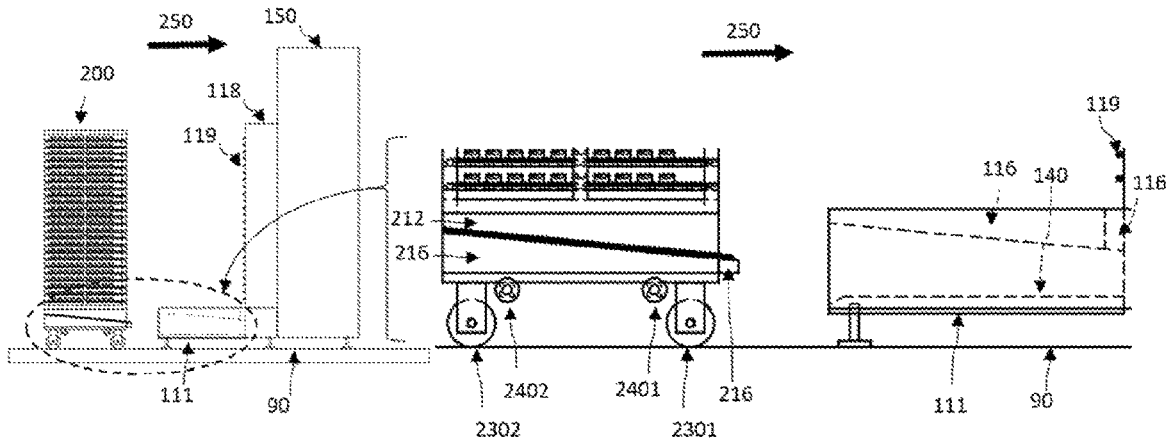
FIG. 7A shows a side view of the interchangeable frame of FIG. 6A which is undocked from the burn-in chamber of FIG. 6B, i.e. in an undocked position.
FIG. 7B shows a partial close-up view of FIG. 7A.
Figures 7C, 7D:
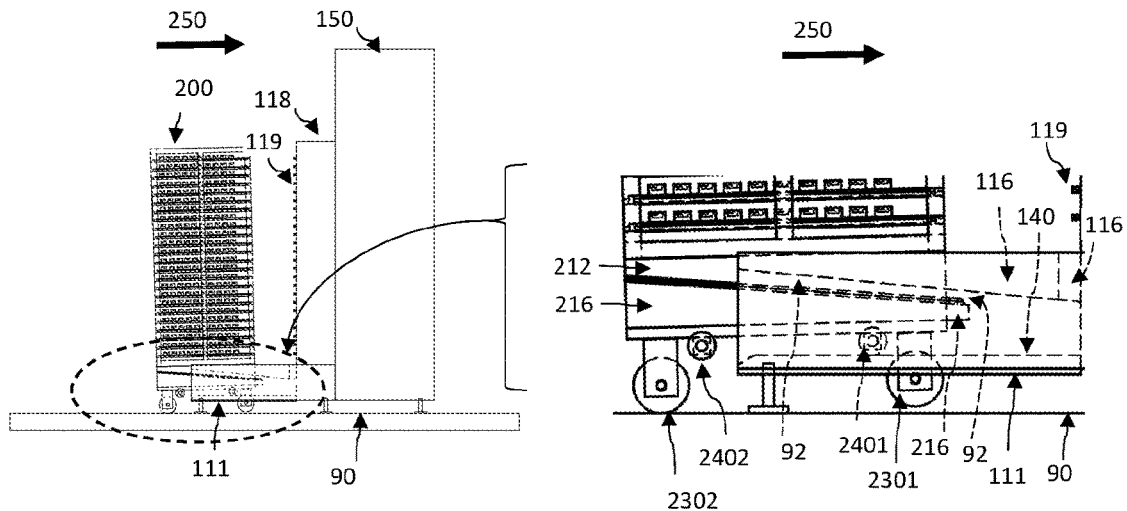
FIG. 7C shows a side view of the interchangeable frame of FIG. 6A which is partially docked in the burn-in chamber of FIG. 6B, i.e. in a partially docked position.
FIG. 7D shows a partial close-up view of FIG. 7C.
Figures 7E, 7F:
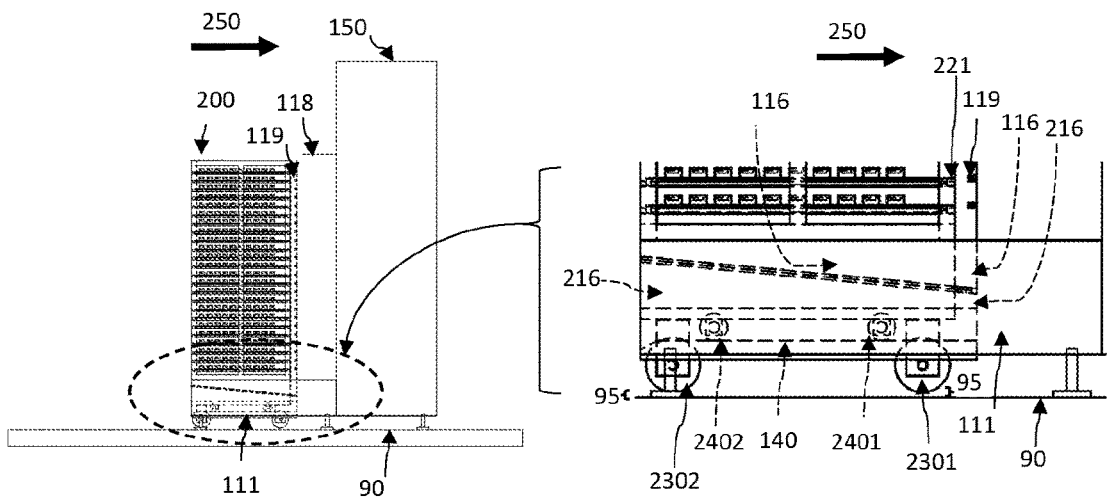
FIG. 7E shows a side view of the interchangeable frame of FIG. 6A which is fully docked in the burn-in chamber of FIG. 6B, i.e. in a docked or fully docked position.
FIG. 7F shows a partial close-up view of FIG. 7E.

FIGS. 7A, 7C, 7E show side views of an interchangeable frame 200 of FIG. 7A which are respectively in undocked position, partially docked position, and docked or fully docked position. FIGS. 7B, 7D, 7F are partial close-up views of FIGS. 7A, 7C, 7E respectively. Accordingly, the motion sequence of the frame 200 shown by FIGS. 7A, 7C, 7E and FIGS. 7B, 7D, 7F each defines a docking direction 250.

In the undocked position (see FIGS. 7A and 7B), the frame 200 is arranged on a ground surface 90 which the burn-in chamber 110 is arranged on. The front rollers 2401 and rear rollers 2402 are free-hanging (e.g. not in contact with nor movably coupled to roller-receiving support 140) while the front wheels 2301 and rear wheels 2302 are arranged on the ground surface 90. Correspondingly, FIGS. 8A and 8B show a front view of an undocked position, e.g. the unoccupied chamber 110 having a set of receiving connectors 119 arranged at its back panel 118, roller-receiving supports 140 arranged along two opposite sides of its base frame 111, and thermal insulation side elements 116 arranged along three sides of its unoccupied base opening 112. In FIGS. 8A and 8B, the roller-receiving supports 140 are arranged below the thermal insulation side elements 116.

In the partially docked position (see FIGS. 7C and 7D), the frame 200 is partially arranged on the chamber 110 and partially arranged on the ground surface 90. In particular, the front rollers 2401 are movably coupled to the roller-receiving supports 140 of the chamber 110 such that the front wheels 2301 of the frame 200 are lifted off the ground surface 90; the rear rollers 2402 are free-hanging such that the rear wheels 2302 of the frame 200 remain arranged on the ground surface 90. In this partially docked position, the cooperating thermal insulation side elements 116, 216 partially overlap each other. Due to their complementary characteristics, the cooperating thermal insulation side elements 116, 216 are spaced apart by a clearance gap 92, e.g. vertical gap, which allows further unimpeded relative motion of the cooperating thermal insulation side elements 116, 216 in the docking direction 250 to increase their overlap.

In the docked position (alternatively referred to as fully docked position, see FIGS. 7E and 7F), the frame 200 is arranged on the chamber 110. In particular, the front rollers 2401 and the rear rollers 2402 are movably coupled to the roller-receiving supports 140 of the chamber 110 such that the front wheels 2301 and the rear wheels 2302 are lifted off the ground surface 90 and hence are no longer arranged on the ground surface 90. In this docked position, the cooperating thermal insulation side elements 116, 216 substantially or fully overlap each other. Due to their complementary characteristics, the clearance gap 92 between the cooperating thermal insulation side elements 116, 216 is substantially reduced or eliminated such that the cooperating thermal insulation side elements 116, 216 abut each other and provide a thermal seal therebetween. Correspondingly, FIGS. 8C and 8D show a front view of the docked position, i.e. a set of receiving connectors 119 in the chamber 110 are aligned to a set of burn-in boards 220 supported on the frame 200, the front rollers 2401 and the rear rollers 2402 of the frame 200 are movably coupled to the roller-receiving supports 140 of the chamber 110, thermal insulation side elements 116 of the chamber 110 abut the cooperating thermal insulation side elements 216 of the frame 200, and the frame 200 is arranged on the chamber 110 such that the front wheels 2301 and the rear wheels 2302 are lifted (see FIGS. 7F and 8D for a gap 95 between wheels 230 and ground surface 90). In the docked position, the front rollers 2401 and the rear rollers 2402, the thermal insulation side element 216 of the frame, and the roller-receiving support 140 of the chamber 110 are arranged outside a thermal zone.

In the embodiment illustrated in FIGS. 6A, 6B, 7A to 7F, 8A to 8D, the frame's rollers 2401, 2402 are arranged below the frame's thermal insulation side elements 216, some of which taper, i.e. towards reduced thickness, from the frame's rear side to its front side while the chamber's roller-receiving supports 140 are arranged below the chamber's thermal insulation side elements 116, some of which taper, i.e. towards reduced thickness, from the base opening's inner side to its outer side. When the frame 200 is in the docked position, the cooperating alignment elements 140, 240 are arranged below the cooperating thermal insulation side elements 116, 216.

Figure 11A:
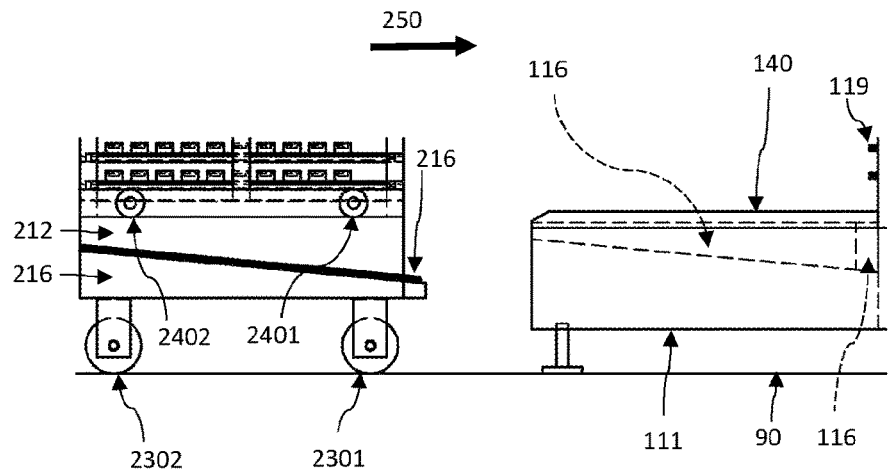
FIG. 11A shows a partial close-up side view of an interchangeable frame, according to yet another embodiment, which is undocked from a burn-in chamber, i.e. in an undocked position.
Figure 11B:
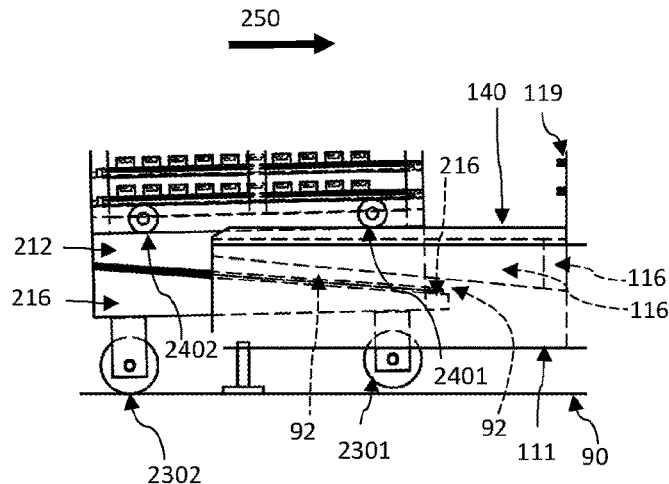
FIG. 11B shows a partial close-up side view of the interchangeable frame of FIG. 11A which is partially docked in the burn-in chamber, i.e. in a partially docked position.
Figure 11C:
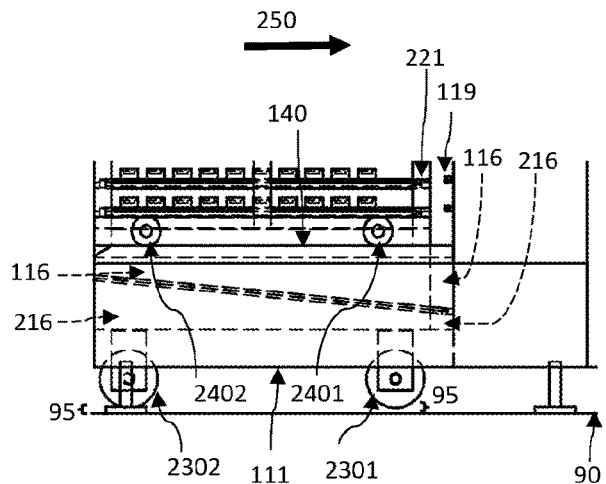
FIG. 11C shows a partial close-up side view of the interchangeable frame of FIG. 11A which is fully docked in the burn-in chamber, i.e. in a docked or fully docked position.

In a modified embodiment illustrated in FIGS. 11A to 110 in which the tapered thermal insulation side elements 116, 216 remain the same as in FIGS. 6A, 6B, 7A to 7F, 8A to 8D (hence their description will not be repeated), the frame's rollers 2401, 2402 are modified to be arranged above the frame's thermal insulation side element 216 while the chamber's roller-receiving supports 140 are modified to be arranged above the chamber's thermal insulation side element 116. FIGS. 11A and 11B show the frame in an undocked position and a partially docked position respectively. When the frame 200 is in the docked position (FIG. 110), the cooperating alignment elements 140, 240 are arranged above the cooperating thermal insulation side elements 116, 216.

Figure 9:
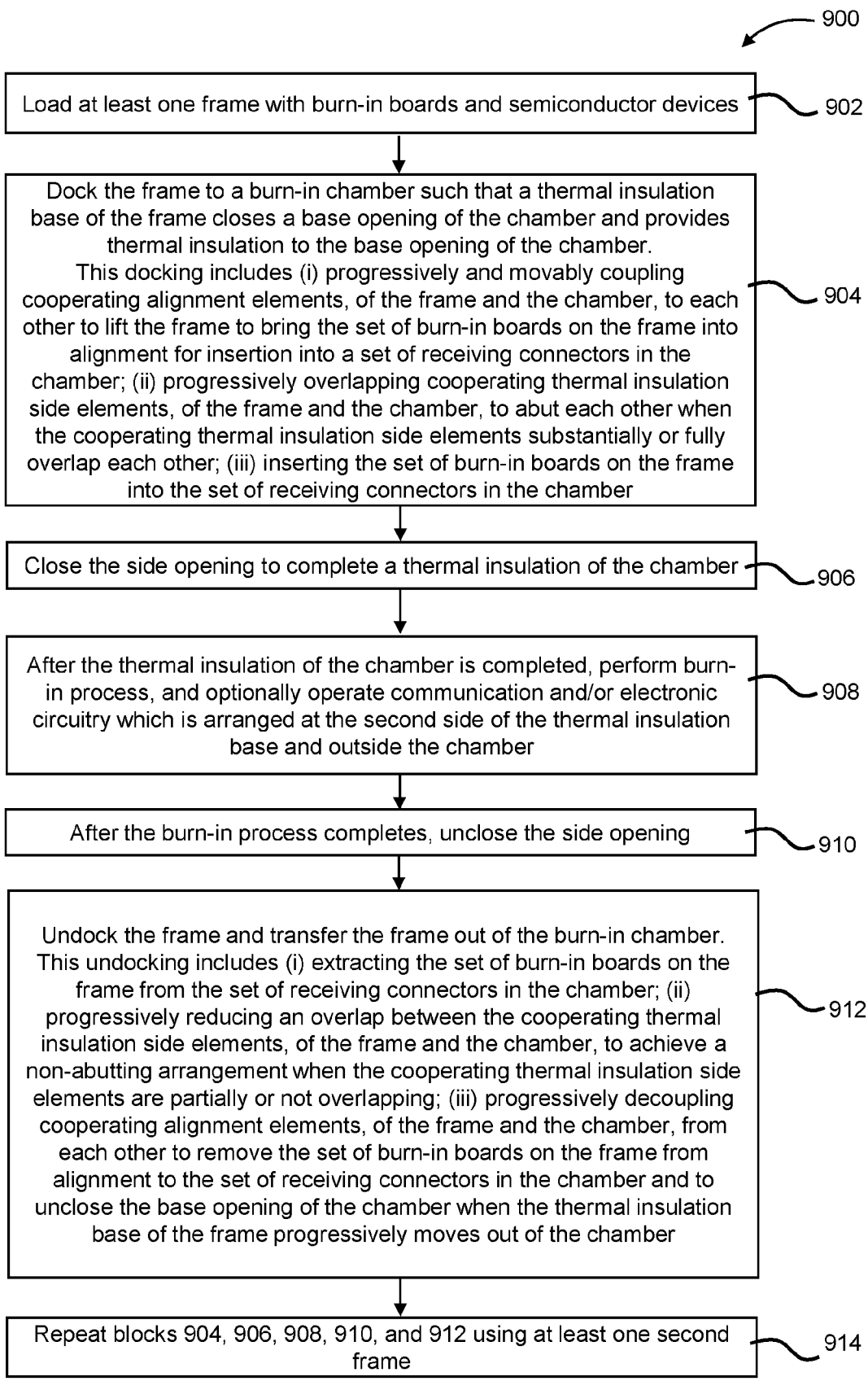
FIG. 9 shows a flow chart for a method for transferring burn-in boards in/out of a burn-in chamber, including a method for alignment and thermal sealing of the frame and the chamber.

FIG. 9 shows a flow chart 900 for a method for/of transferring frame supporting a set of burn-in boards in/out of a burn-in chamber, including a method for alignment and thermal sealing of the frame and the chamber.

In block 902 of FIG. 9, at least one frame is loaded with a set of burn-in boards and semiconductor devices. Loading of semiconductor devices onto the set of burn-in boards may be performed by a burn-in load/unload apparatus (not shown) when the frame is docked therein.

In block 904 of FIG. 9, the loaded frame, including the rack supporting burn-in boards, are transferred into a burn-in chamber having a set of receiving connectors arranged therein. During this transfer-in or docking process, the loaded frame is progressively moved into the chamber through its side opening while at least a thermal insulation base of the frame progressively closes the base opening of the chamber. In particular, this transfer-in or docking process includes progressively and movably coupling the cooperating alignment elements of the frame and the chamber, to each other to lift the frame to bring the set of burn-in boards on the frame or rack into alignment for insertion into the set of receiving connectors in the chamber and to close the base opening of the chamber by arranging the thermal insulation base of the frame in the base opening of the chamber, thereby removably docking the frame in the chamber. More particularly, the progressive and movable coupling includes mounting or lifting front rollers of the frame onto the roller-receiving support of the chamber, thereby lifting front wheels of the frame off a ground surface while maintaining rear wheels of the frame on the ground surface, and subsequently mounting or lifting rear rollers of the frame onto the roller-receiving support of the chamber, thereby lifting rear wheels of the frame off the ground surface and thereby maintaining both the front and the rear wheels of the frame off the ground surface. Concurrently, the progressive and movable coupling also includes progressively overlapping the cooperating thermal insulation side elements which complementary characteristics provide a clearance gap therebetween when the cooperating thermal insulation side elements partially overlap each other, and an abutting fit therebetween when the cooperating thermal insulation side elements substantially or fully overlap each other.

The transfer-in or docking process may include inserting the set of burn-in boards on the frame or rack into the set of receiving connectors in the chamber, more specifically inserting the interfacing connectors of the burn-in boards into the receiving connectors in the chamber. This insertion may take place after docking, e.g. board-by-board insertion or insertion of multiple boards at the same time. Alternatively, this insertion may take place upon or concurrent with fully docking the frame in the chamber.

This transfer-in or docking process may include, prior to moving the loaded frame into the chamber, moving the loaded frame from the burn-in load/unload apparatus to the chamber without unloading the set of burn-in boards from the rack or the frame.

In block 906 of FIG. 9, the side opening is closed by using or actuating at least one or more doors or covers designated for this purpose. When the base opening is closed by docking the frame in the chamber, and the side opening is also closed, thermal insulation of the chamber is completed, thereby defining a thermal zone which is configured to be subject to burn-in condition, e.g. temperature, provided by the chamber. At this time, a first side of the thermal insulation base and the rack, both of the frame, are inside the chamber or thermal zone while a second side of the thermal insulation base of the frame is outside the chamber or thermal zone.

In block 908 of FIG. 9, burn-in process takes place or is performed inside the chamber or thermal zone. Temperature in the chamber or thermal zone is set to the desired burn-in temperature. The burn-in boards supported by the frame as well as the first side of the insulation base of the frame are exposed to the burn-in temperature. The second side of the insulation base, together with any wheels and/or any communication and electronic circuitry, is outside the chamber or thermal zone and hence not exposed to the chamber or thermal zone temperature and therefore remains at ambient temperature. During burn-in process, the electronic circuitry may operate, e.g. communication circuitry may operate to send and/or receive signals to one or more devices, e.g. communication device, remote from the burn-in apparatus.

In block 910 of FIG. 9, burn-in process completes. The side opening is unclosed, e.g. the door or cover is opened to allow access of the loaded frame and/or burn-in boards in the chamber through the side opening.

In block 912, the loaded frame is transferred out of the chamber. During this transfer-out or undocking process, the interfacing connectors of the set of burn-in boards on the frame are extracted from the set of receiving connectors in the chamber. This extraction may include board-by-board extraction or extraction of multiple boards at the same time. The base opening is then unclosed or revealed by undocking the loaded frame from the chamber and progressively moving it out of the chamber through the side opening until the frame is outside or away from the base opening. In particular, this transfer-out or undocking process includes progressively reducing an overlap of the cooperating thermal insulation side elements to undo the abutting fit to provide a clearance gap or non-abutting arrangement therebetween when the cooperating thermal insulation side elements progressively reduce their overlap, i.e. reduce from substantially or fully overlap to partial overlap or no overlap. Concurrently, the progressive and movable decoupling also includes progressively and movably decoupling cooperating alignment elements of the frame and the chamber, from each other to lower the frame from the chamber to unalign the set of burn-in boards on the frame from the set of receiving connectors in the chamber and to unclose the base opening of the chamber when the thermal insulation base of the frame progressively moves out of the chamber. More particularly, this includes decoupling rear rollers of the frame from the roller-receiving support of the chamber thereby lowering rear wheels of the frame to a ground surface while maintaining front wheels of the frame coupled to the roller-receiving support of the chamber, and subsequently decoupling front rollers of the frame from the roller-receiving support of the chamber thereby lowering front wheels of the frame to the ground surface and thereby arranging the front and the rear wheels of the frame on the ground surface.

In the undocked position, the thermal insulation base of the frame uncloses or reveals the base opening of the chamber, hence the thermal insulation of the chamber is incomplete even if the side opening of the chamber may be closed. The loaded frame may then be transferred into the burn-in load/unload apparatus without unloading the set of burn-in boards from the rack or the frame. At the burn-in load/unload apparatus, the semiconductor devices that had completed the burn-in process may be unloaded from the set of burn-in boards.

It is to be appreciated that the above-described and/or illustrated embodiments and/or example may be modified or varied as described below.

In one embodiment, the chamber may accommodate more than one frame and therefore have one or more base openings and one or more side openings. Accordingly, the base opening(s) may be closable by docking two or more frames in the chamber. Each frame provides a thermal insulation base such that a combination of the frame's insulation bases abuts the chamber and/or the chamber's thermal insulation side element to close the base opening(s) of the chamber. In one example, multiple frames are adjacently arranged to close a single base opening while in another example, multiple frames are arranged to respectively close multiple base openings. In one example, all docked frames are loaded with burn-in boards while in another example, at least one docked frame is devoid of burn-in boards or is non-loaded but is necessarily docked in the chamber in order to close the base opening(s) to complete thermal insulation of the chamber.

In the embodiments shown in the Figures, thermal insulation side element may be provided along three sides of the base opening of the chamber and also three sides of the thermal insulation base of the frame. In some other embodiments (not shown), thermal insulation side element may be provided along one or more sides of the base opening of the chamber and also one or more sides of the thermal insulation base of the frame. In yet some other embodiments, no thermal insulation side element may be provided along any side of the base opening(s) of the chamber and the thermal insulation base of the frame. In other words, the thermal insulation base of the frame may be configured to abut the chamber, at its base opening, in mutual direct contact.

In the embodiments shown in the Figures, wheels are provided to the frame. In some other embodiments (not shown), no wheel may be provided to the frame. As such, a vehicle may be required to transfer the frame into and out of the burn-in chamber; the frame may include at least one non-wheel arrangement which is to be arranged on or engaged with the vehicle during transportation of the frame. The vehicle may be human-operated and/or automated, e.g. autonomous guided vehicle (AGV), autonomous robot vehicle (ARV). Accordingly, it is to be appreciated that preceding references to "wheels" may not be relevant and can be omitted. Instead, the non-wheel arrangement of the frame may be arranged on an AGV when the frame is undocked, partially arranged on both the AGV and the chamber when the frame is partially docked, and arranged on the chamber when the frame is docked or fully docked. Hence, in this context, preceding references to arranging the frame on a ground surface may be replaced by arranging the frame on an AGV which in turn is arranged on the ground surface.

In the embodiments shown in the Figures, wheels of the frame and the chamber, e.g. its base frame, adjustable supporting foot mounts, or bottom of the chamber, are arranged on the same ground surface prior to docking the frame in the chamber, whether AGV is used or not. In some other embodiments (not shown), the frame and the chamber may be arranged on different surfaces prior to docking, e.g. the chamber may be arranged on a ground surface while the wheels of the frame may be arranged on a platform or equivalent which in turn is arranged on the ground surface or the non-wheel arrangement of the frame may be arranged on an AGV. Hence, docking the frame in the chamber would result in lifting the wheels off the platform or equivalent, or lifting the non-wheel arrangement off the platform or AGV. Hence, reference to ground surface may refer to the above-mentioned platform or equivalent.

In the embodiments shown in the Figures, cooperating alignment elements are provided at the bottom or near bottom of both the frame and the chamber, e.g. rollers are arranged proximal to the thermal insulation base of the frame and hence roller-receiving supports are arranged proximal to the base opening of the chamber at a complementary position to cooperate with the rollers as described in the foregoing. In some other embodiments (not shown), rollers may be arranged at any suitable position along a height of the frame, e.g. mid-height, near top or top, or any intermediate position along the frame's height, and hence roller-receiving supports may be arranged at a complementary position, e.g. mid-height, near top or top, or any intermediate position along the chamber's height, to facilitate cooperation with the rollers as described in the foregoing. In the embodiments shown in the Figures, one set of alignment elements is illustrated. In some other embodiments (not shown), more than one set of alignment elements may be provided at two or more of the above-described positions. Similarly, in the embodiments shown in the Figures, cooperating thermal insulation side elements are provided at the bottom or near bottom of both the frame and the chamber. In some other embodiments (not shown), cooperating thermal insulation side elements may be provided at any suitable position along the height of both the frame and the chamber. Also, one or more sets of thermal insulation side elements may be provided at two or more of the above-described positions.

In the embodiments shown in the Figures, gradients of thermal insulation side elements are linear or straight-line. In some other embodiments (not shown), gradients may be piecewise linear, non-linear, e.g. curved, or any combination thereof. However, the gradients should preferably be complementary to allow unimpeded relative motion of the thermal insulation side elements along docking direction to increase overlap and provide abutting fit when the thermal insulation side elements are substantially or fully overlapping.

In the embodiments shown in the Figures, a plurality of rollers are arranged at the frame while at least one roller-receiving support is arranged at the chamber, i.e. rollers 240 is arranged on roller-receiving support 140 when the frame 200 is docked in the chamber 110. In some other embodiments (not shown), a plurality of rollers are arranged at the chamber and at least one roller-receiving support is arranged at the frame, i.e. roller-receiving support 140 is arranged on rollers 240 when the frame 200 is docked in the chamber 110.

In the embodiments shown in the Figures, both cooperating alignment elements and cooperating thermal insulation side elements are provided as separate mechanisms. In some other embodiments (not shown), only cooperating alignment elements are provided which may integrally provide a thermal sealing function in addition to alignment function. An example having this dual function is a cooperating slide rail assembly having at least one insulated fixed rail and at least one complementary insulated sliding device. In yet some other embodiments, only cooperating thermal insulation side elements are provided which may integrally provide an alignment function in addition to thermal sealing function. An example having this dual function is the cooperating thermal insulation side elements only which also function as cooperating alignment elements. This example may be envisaged by removing the rollers 2401, 2402 and the roller-receiving supports 140 shown in FIGS. 3A, 3B, 4A to 4F, 5A to 5D.

In yet some other embodiments (not shown), the cooperating thermal insulation side elements may additionally function as roller or roller-receiving support. This example may be envisaged by modifying FIGS. 6A, 6B, 7A to 7F, 8A to 8D, e.g. arranging rollers 2401, 2402 in place of the roller-receiving supports 140, and using bottom surface of thermal insulation side element 216 as the roller-receiving support.

In some embodiments, cooperating alignment elements may additionally include at least one dowel or guide pin arranged at the chamber and at least one dowel or guide pin receiver, e.g. opening, arranged at the frame, or vice versa. These additional cooperating alignment elements further ensure desired alignment of the frame during and upon docking.

In some embodiments, a frame includes first alignment elements, e.g. rollers, and first thermal insulation side elements while a burn-in chamber includes second alignment elements, e.g. roller receiving support(s), and second thermal insulation side elements. In some other embodiments, a burn-in chamber includes first alignment elements, e.g. roller-receiving support(s), and first thermal insulation side elements while a frame includes second alignment elements, e.g. rollers, and second thermal insulation side elements. Accordingly, the phrases "first alignment elements" and "second alignment elements" may each refer to different features in different contexts.

In FIGS. 1A to 1D, each burn-in board 220 includes a plurality of interfacing connectors 221 for insertion into a plurality of receiving connectors 119. In some other embodiments, each burn-in board 220 may include only one interfacing connector 221 for insertion into only one receiving connector 119.

It is to be appreciated that the above-described embodiments and/or examples may be selectively combined.

Embodiments of the invention provide several advantages, e.g. issues caused by unevenness of ground surface are resolved. Alignment of the burn-in boards carried by the frame to the receiving connectors in the burn-in chamber is independent of the ground surface condition and can be easily and conveniently achieved. Once the frame is docked in the chamber, the position of burn-in boards is taken with reference from the chamber, e.g. chamber base frame, instead of the ground surface. Particularly, the frame may be lifted off or spaced from the ground surface or AGV which previously carries or supports the frame, e.g. the frame's wheels which were arranged on the ground surface prior to docking are arranged on the chamber, e.g. chamber base frame, upon docking, or the frame's non-wheel arrangement which was arranged on an AGV is arranged on the chamber, e.g. chamber base frame, upon docking. Furthermore, thermal sealing between cooperating thermal insulation side elements of the frame and the chamber is also independent of the ground surface condition upon docking and adequate thermal sealing can be easily and conveniently achieved without producing much impedance or frictional wear of the thermal insulation side elements. Furthermore, embodiments of the invention enable hassle-free installation of new burn-in chamber and relocation of existing burn-in chamber without having to overcome uneven ground surface at the new location or throughout the entire burn-in production floor.

It is to be understood that the embodiments and features described above should be considered exemplary and not restrictive. Many other embodiments will be apparent to those skilled in the art from consideration of the specification and practice of the invention. Furthermore, certain terminology has been used for the purposes of descriptive clarity, and not to limit the disclosed embodiments of the invention.

The invention claimed is:

1. A burn-in apparatus for performing burn-in process on semiconductor devices or integrated circuits, the apparatus comprising:

a burn-in chamber having at least one side opening, at least one base opening, and a set of receiving connectors arranged in the chamber;

at least one door or cover adapted to close the side opening;

at least one interchangeable frame which is movable through the side opening and removably dockable in the chamber to close the base opening, each frame having a thermal insulation base having a first and a second side, and a rack arranged at the first side of the thermal insulation base and supporting a set of burn-in boards, wherein each frame further includes wheels which are manual or power assisted or adapted to be used with an autonomous guided vehicle (AGV) or a non-wheel arrangement which is adapted to be used with the AGV, wherein the wheels or the non-wheel arrangement is arranged at the second side of the thermal insulation base; and a plurality of cooperating alignment elements respectively arranged at the frame and the chamber, and configured to progressively couple to each other when the frame is moved into the chamber through the side opening of the chamber, thereby lifting the wheels of the frame off a ground surface or the non-wheel arrangement of the frame off the AGV when the cooperating alignment elements are coupled to each other, bringing the set of burn-in boards that are supported by the rack into alignment for insertion into the set of receiving connectors in the chamber and closing the base opening by arranging at least the thermal insulation base of the frame in the base opening of the chamber, thereby removably docking the frame in the chamber, wherein when the side opening is closed and each frame is removably docked in the chamber, a thermal insulation of the chamber is completed thereby defining a thermal zone configured to be subject to burn-in condition provided by the chamber, such that the rack, the set of burn-in boards and the first side of the thermal insulation base are in the thermal zone while the second side of the thermal insulation base is outside the thermal zone.

2. The burn-in apparatus of claim 1, further comprising:
a plurality of cooperating thermal insulation side elements respectively arranged at the frame and the chamber, and respectively having complementary characteristics configured to provide a clearance gap between the cooperating thermal insulation side elements when the cooperating thermal insulation side elements partially overlap each other and further configured to provide an abutting fit between the cooperating thermal insulation side elements when the cooperating thermal insulation side elements substantially or fully overlap each other.

3. The burn-in apparatus of claim 2,
wherein the wheels of the frame include at least front wheels and rear wheels,
wherein the cooperating alignment elements include a plurality of rollers comprising at least front rollers and rear rollers, and further include at least one roller-receiving support, wherein the front rollers and the rear rollers are configured to respectively lift the front wheels and the rear wheels when the front rollers and the rear rollers are respectively coupled to the roller-receiving support,
wherein the cooperating alignment elements are arranged either
above the cooperating thermal insulation side elements such that when the side opening is closed and each frame is removably docked in the chamber, the cooperating alignment elements are arranged inside the thermal zone, or
below the cooperating thermal insulation side elements such that when the side opening is closed and each frame is removably docked in the chamber, the cooperating alignment elements are arranged outside the thermal zone.

4. The burn-in apparatus of claim 3, wherein
the rollers are arranged at the frame and the roller-receiving support is arranged at the chamber; or
the rollers are arranged at the chamber and the roller-receiving support is arranged at the frame.

5. The burn-in apparatus of claim 2, wherein the cooperating alignment elements and/or the cooperating thermal insulation side elements are arranged proximal to or at the thermal insulation base of the frame and the base opening of the chamber.

6. A method comprising:
transferring a set of burn-in boards into a chamber by moving at least one frame into the chamber through a side opening thereof, wherein each frame includes a thermal insulation base having a first and a second side and a rack which is arranged at the first side of the thermal insulation base and supports the set of burn-in boards, wherein the chamber includes a set of receiving connectors arranged therein, wherein a plurality of cooperating alignment elements are respectively arranged at the frame and the chamber, wherein each frame further includes wheels which are manual or power assisted or are adapted to be used with an autonomous guided vehicle (AGV), or a non-wheel arrangement which is adapted to be used with the AGV, wherein the wheels or the non-wheel arrangement is arranged at the second side of the thermal insulation base;
completing a thermal insulation of the chamber thereby defining a thermal zone configured to be subject to burn-in temperature provided by the chamber, including:
progressively coupling the cooperating alignment elements to each other when the frame is moved into the chamber through the side opening of the chamber, thereby lifting the wheels of the frame off a ground surface or the non-wheel arrangement of the frame off the AGV when the cooperating alignment elements are coupled to each other, bringing the set of burn-in boards on the rack into alignment for insertion into the set of receiving connectors in the chamber and closing a base opening of the chamber by arranging at least the thermal insulation base of the frame in the base opening of the chamber, thereby removably docking the frame in the chamber,
inserting the set of burn-in boards into the set of receiving connectors in the chamber, and
closing the side opening such that the rack, the set of burn-in boards, and the first side of the thermal insulation base are in the thermal zone while a second side of the thermal insulation base is outside the thermal zone; and
performing burn-in process on semiconductor devices arranged in the set of burn-in boards.

7. The method of claim 6, wherein progressively coupling the cooperating alignment elements to each other includes:
progressively overlapping a plurality of cooperating thermal insulation side elements which are respectively arranged at the frame and the chamber;
providing, by complementary characteristics of the cooperating thermal insulation side elements, a clearance gap between the cooperating thermal insulation side elements when the cooperating thermal insulation side elements partially overlap each other; and
providing, by the complementary characteristics of the cooperating thermal insulation side elements, an abutting fit between the cooperating thermal insulation side elements when the cooperating thermal insulation side elements substantially or fully overlap each other.

8. The method of claim 7, wherein the wheels of the frame include at least front wheels and rear wheels,
wherein the cooperating alignment elements include a plurality of rollers comprising at least front rollers and rear rollers, and further include at least one roller-receiving support,
wherein progressively coupling the cooperating alignment elements to each other to lift the frame to bring the set of burn-in boards on the rack into alignment for insertion into the set of receiving connectors in the chamber includes respectively lifting the front wheels and the rear wheels when the front rollers and the rear rollers are respectively coupled to the roller-receiving support, wherein the cooperating alignment elements are arranged either
above the cooperating thermal insulation side elements such that when the side opening is closed and each frame is removably docked in the chamber, the cooperating alignment elements are arranged inside the thermal zone, or
below the cooperating thermal insulation side elements such that when the side opening is closed and each frame is removably docked in the chamber, the cooperating alignment elements are arranged outside the thermal zone.

9. The method of claim 8, wherein
the rollers are arranged at the frame and the roller-receiving support is arranged at the chamber; or
the rollers are arranged at the chamber and the roller-receiving support is arranged at the frame.

10. A burn-in chamber apparatus comprising:
a chamber having at least one side opening, at least one base opening intersecting the side opening, a set of receiving connectors arranged in the chamber, and a first alignment element arranged at the chamber,
wherein at least the base opening, when unclosed, is configured to allow fluid communication between an interior of the chamber and an exterior of the chamber and to incomplete a thermal insulation of the chamber,
wherein the first alignment element is configured to be progressively coupled to a cooperating second alignment element of at least one frame when the frame is moved into the chamber through the side opening of the chamber, wherein each frame further includes wheels which are manual or power assisted or adapted to be used with an autonomous guided vehicle (AGV), or a non-wheel arrangement which is adapted to be used with the AGV, thereby lifting the wheels of the frame off a ground surface or the non-wheel arrangement of the frame off the AGV when the cooperating alignment elements are coupled to each other, bringing a set of burn-in boards on the frame into alignment for insertion into the set of receiving connectors in the chamber and closing the base opening of the chamber by arranging a thermal insulation base having a first and a second side of the frame in the base opening of the chamber, thereby removably docking the frame in the chamber,
wherein the wheels or the non-wheel arrangement is arranged at the second side of the thermal insulation base,
wherein the thermal insulation of the chamber is configured to be completed when the side opening is closed and each frame is removably docked in the chamber to thereby define a thermal zone configured to be subject to burn-in condition provided by the chamber.

11. The burn-in chamber of claim 10, further comprising a first thermal insulation side element having a first characteristic which is complementary to a second characteristic of a second thermal insulation side element arranged at the frame, and configured to provide a clearance gap from the second thermal insulation side element when the first thermal insulation side element and the second thermal insulation side element partially overlap each other and to provide an abutting fit when the first thermal insulation side element and the second thermal insulation side element substantially or fully overlap each other.

12. The burn-in chamber of claim 11,
wherein the first and the second alignment elements include at least one roller-receiving support and a plurality of rollers comprising at least front rollers and rear rollers, wherein the front rollers and the rear rollers are configured to respectively lift front wheels and rear wheels of the frame when the front rollers and the rear rollers are respectively coupled to the roller-receiving support,
wherein the first and the second alignment elements are arranged either
above the first and the second thermal insulation side elements such that when the side opening is closed and each frame is removably docked in the chamber, the cooperating alignment elements are arranged inside the thermal zone, or
below the first and the second thermal insulation side elements such that when the side opening is closed and each frame is removably docked in the chamber, the cooperating alignment elements are arranged outside the thermal zone.

13. The burn-in chamber of claim 12, wherein the first alignment element includes at least one roller-receiving support or a plurality of rollers.

14. The burn-in chamber of claim 11, wherein the first alignment element and/or the first thermal insulation side element are arranged proximal to or at the base opening.

15. A frame for transporting burn-in boards, the frame comprising:
a rack supporting a set of burn-in boards;
a thermal insulation base having a first side and a second side, wherein the rack is arranged at the first side of the thermal insulation base; and
wheels which are manual or power assisted or adapted to be used with an autonomous guided vehicle (AGV), or a non-wheel arrangement which is adapted to be used with the AGV, wherein the wheels or the non-wheel arrangement is arranged at the second side of the thermal insulation base; and
a first alignment element configured to progressively couple to a cooperating second alignment element of a chamber when the frame is moved into the chamber through a side opening of the chamber, thereby lifting the wheels of the frame off a ground surface or the non-wheel arrangement of the frame off the AGV when the cooperating alignment elements are coupled to each other, bringing the set of burn-in boards on the rack into alignment for insertion into a set of receiving connectors arranged in the chamber and closing a base opening of the chamber by arranging the thermal insulation base in the base opening of the chamber, thereby removably docking the frame in the chamber such that when the side opening of the chamber is closed, a thermal insulation of the chamber is completed to define a thermal zone configured to be subject to burn-in temperature of the chamber, and such that the rack, the burn-in boards, and the first side of the thermal insulation base are in the thermal zone while the second side of the thermal insulation base is outside the thermal zone.

16. The frame of claim 15, further comprising a first thermal insulation side element having a first characteristic which is complementary to a second characteristic of a second thermal insulation side element arranged at the chamber, and configured to provide a clearance gap from the second thermal insulation side element when the first thermal insulation side element and the second thermal insulation side element partially overlap each other and further configured to provide an abutting fit when the first thermal insulation side element and the second thermal insulation side element substantially or fully overlap each other.

17. The frame of claim 16,
wherein the wheels include at least front wheels and rear wheels,
wherein the first and the second alignment elements include a plurality of rollers comprising at least front rollers and rear rollers, and further include at least one roller-receiving support, wherein the front rollers and the rear rollers are configured to respectively lift the front wheels and the rear wheels when the front rollers and the rear rollers are respectively coupled to the roller-receiving support,
wherein the first and the second alignment elements are arranged either
above the first and the second thermal insulation side elements such that when the side opening is closed and each frame is removably docked in the chamber, the cooperating alignment elements are arranged inside the thermal zone, or
below the first and the second thermal insulation side elements such that when the side opening is closed and each frame is removably docked in the chamber, the cooperating alignment elements are arranged outside the thermal zone.

18. The frame of claim 17, wherein the first alignment element includes a plurality of rollers or at least one roller-receiving support.

19. The frame of claim 16, wherein the first alignment element and/or the first thermal insulation side element are arranged proximal to or at the thermal insulation base.

\* \* \* \* \*